US010957702B2

(12) United States Patent
Oga et al.

(10) Patent No.: US 10,957,702 B2
(45) Date of Patent: Mar. 23, 2021

(54) SEMICONDUCTOR MEMORY DEVICE

(71) Applicant: TOSHIBA MEMORY CORPORATION, Tokyo (JP)

(72) Inventors: Atsushi Oga, Yokkaichi Mie (JP); Hideaki Harakawa, Yokkaichi Mie (JP); Satoshi Nagashima, Yokkaichi Mie (JP); Natsuki Fukuda, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/296,001

(22) Filed: Mar. 7, 2019

(65) Prior Publication Data

US 2020/0075615 A1 Mar. 5, 2020

(30) Foreign Application Priority Data

Aug. 31, 2018 (JP) .............................. JP2018-163559

(51) Int. Cl.

| *H01L 27/11556* | (2017.01) |
| *H01L 27/11582* | (2017.01) |
| *H01L 21/762* | (2006.01) |
| *H01L 21/311* | (2006.01) |
| *H01L 27/1157* | (2017.01) |
| *H01L 27/11524* | (2017.01) |

(52) U.S. Cl.
CPC .. *H01L 27/11556* (2013.01); *H01L 21/76224* (2013.01); *H01L 27/11582* (2013.01); *H01L 21/31111* (2013.01); *H01L 21/31116* (2013.01); *H01L 27/1157* (2013.01); *H01L 27/11524* (2013.01)

(58) Field of Classification Search
None
See application file for complete search history.

(56) References Cited

U.S. PATENT DOCUMENTS

| 6,218,287 B1 | 4/2001 | Matsumoto |
| 6,698,153 B2 | 3/2004 | Ezumi et al. |
| 6,909,132 B2 | 6/2005 | Yoshihara et al. |

(Continued)

FOREIGN PATENT DOCUMENTS

| JP | 3312604 B2 | 8/2002 |
| JP | 5670681 B2 | 2/2015 |

(Continued)

*Primary Examiner* — Grant S Withers
(74) *Attorney, Agent, or Firm* — Foley & Lardner LLP

(57) ABSTRACT

According to an embodiment, a semiconductor memory device includes: a first stacked body including a first semiconductor layer, a first memory film, a second semiconductor layer and a first insulating layer; a joining member provided on the first semiconductor layer, the second semiconductor layer, and the first insulating layer; a first layer provided above the joining member and covering the first semiconductor layer and the first memory film; a second layer provided above the joining member, located away from the first layer as viewed in a second direction perpendicular to the first direction, and covering the second semiconductor layer and the second memory film; a second stacked body including a third semiconductor layer, a fourth semiconductor layer, a fourth memory film and a second insulating layer.

9 Claims, 25 Drawing Sheets

(56) References Cited

U.S. PATENT DOCUMENTS

| | | | |
|---|---|---|---|
| 8,409,977 B2* | 4/2013 | Shim | H01L 27/11582 438/589 |
| 2016/0079272 A1* | 3/2016 | Lee | H01L 27/11582 438/269 |
| 2016/0204117 A1 | 7/2016 | Liu | |

FOREIGN PATENT DOCUMENTS

| | | |
|---|---|---|
| JP | 2017-017359 | 1/2017 |
| TW | 201607045 A | 2/2016 |

\* cited by examiner

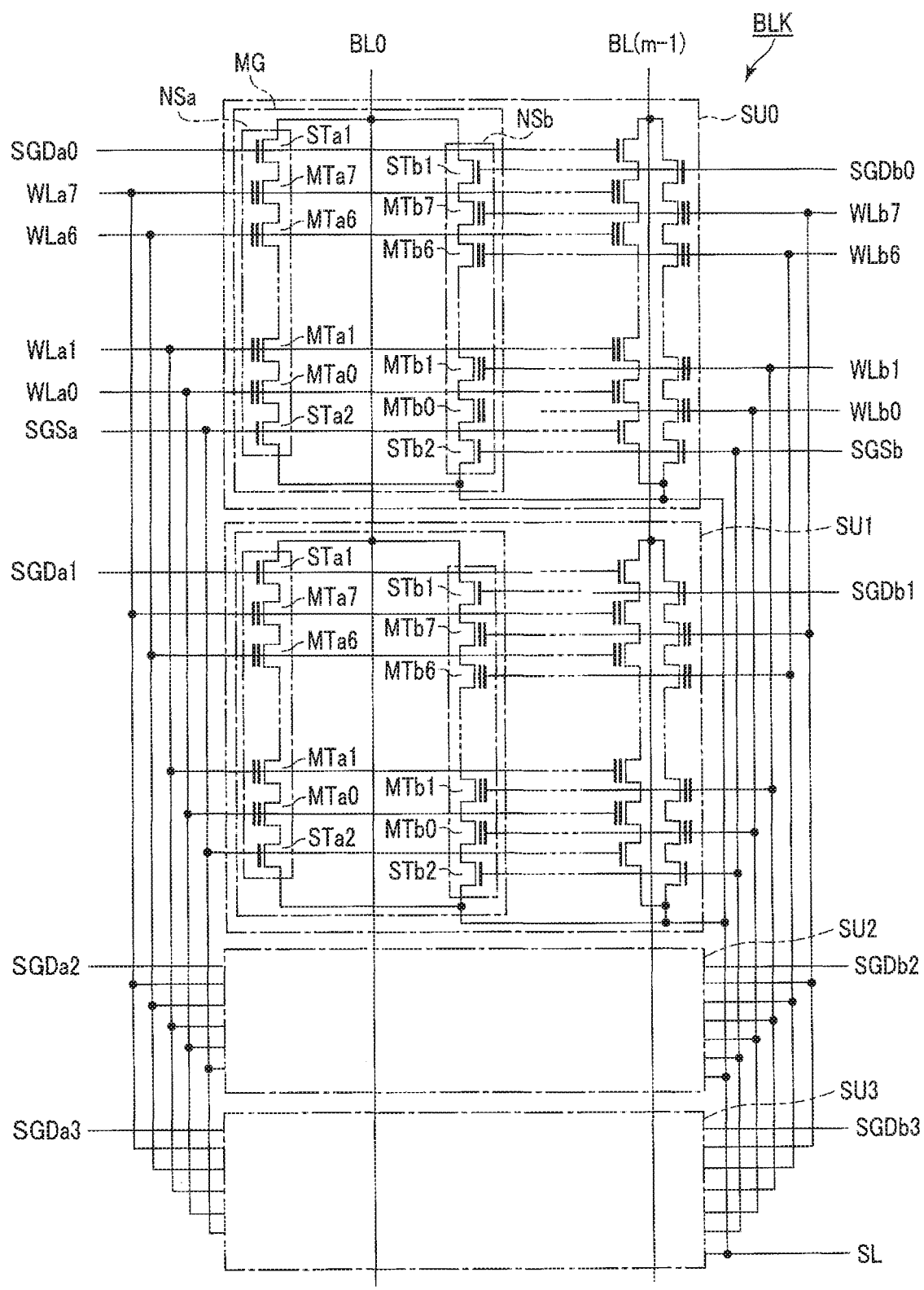
F I G. 2

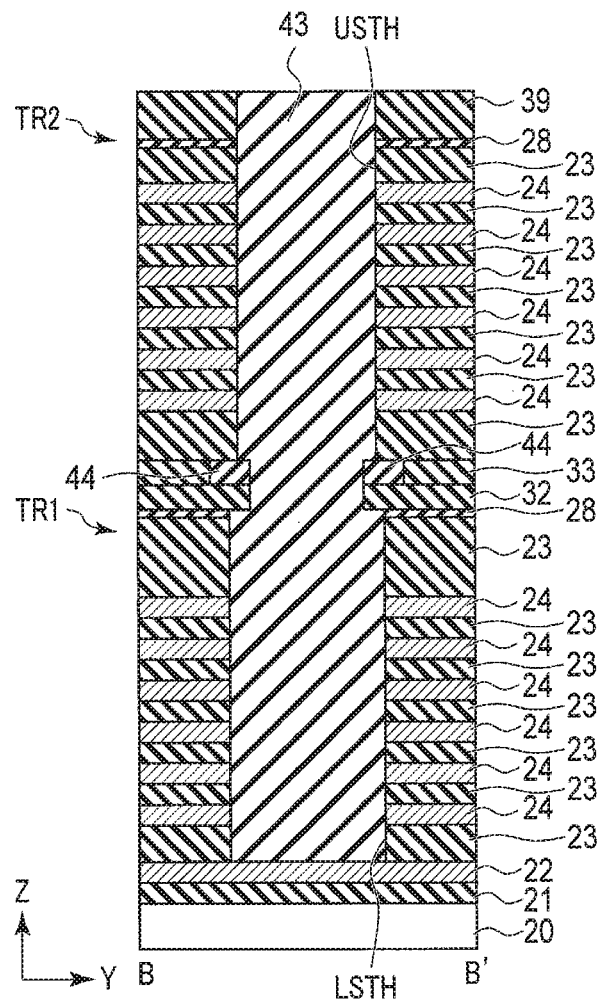
F I G. 5

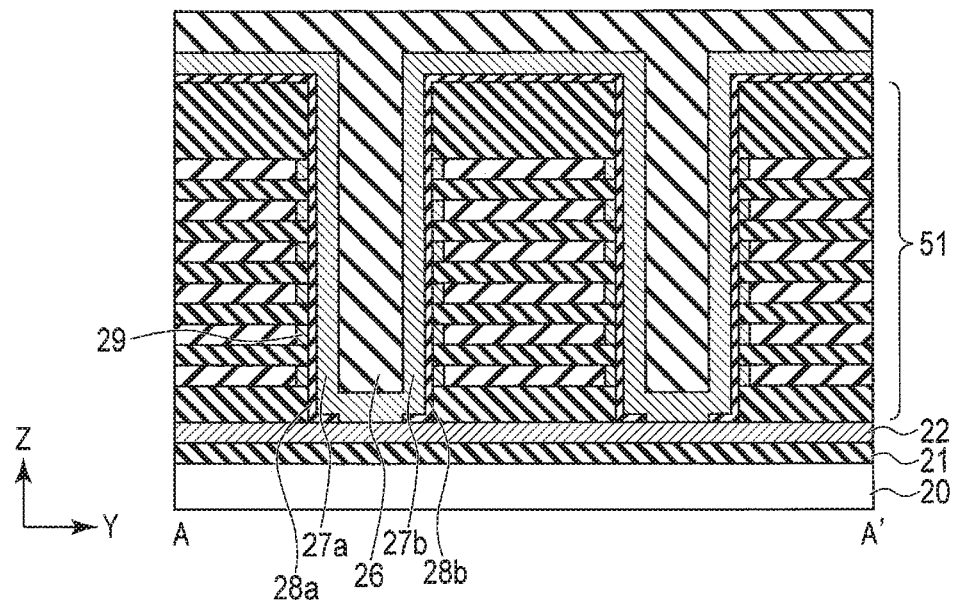
F I G. 14
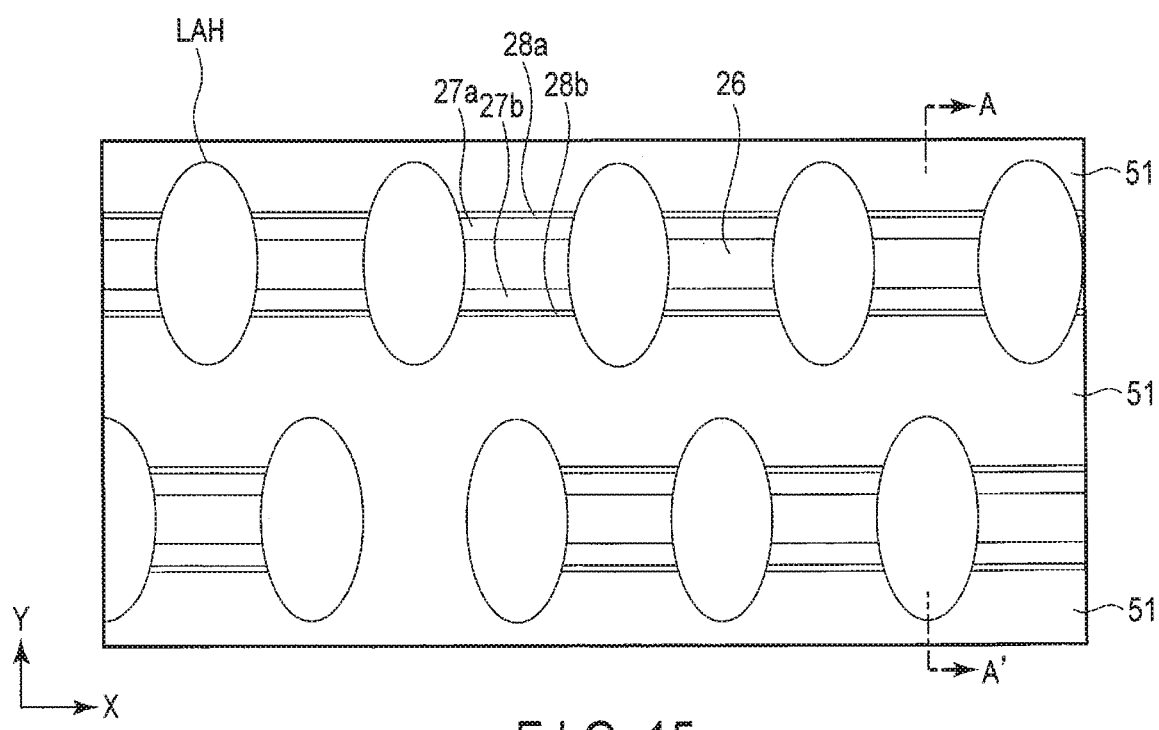
F I G. 15

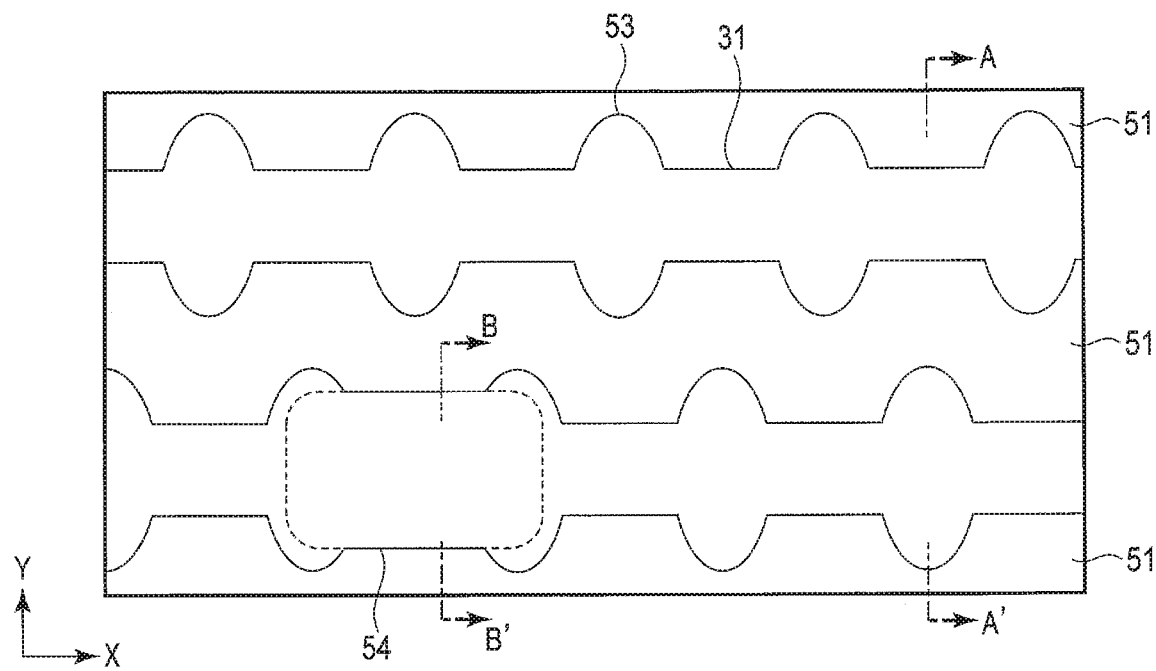
F I G. 20
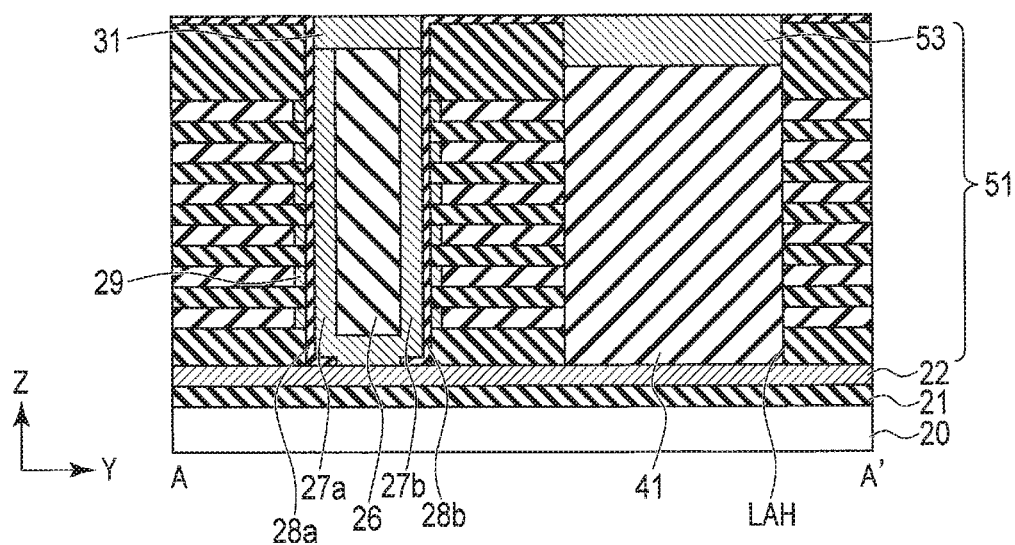
F I G. 21

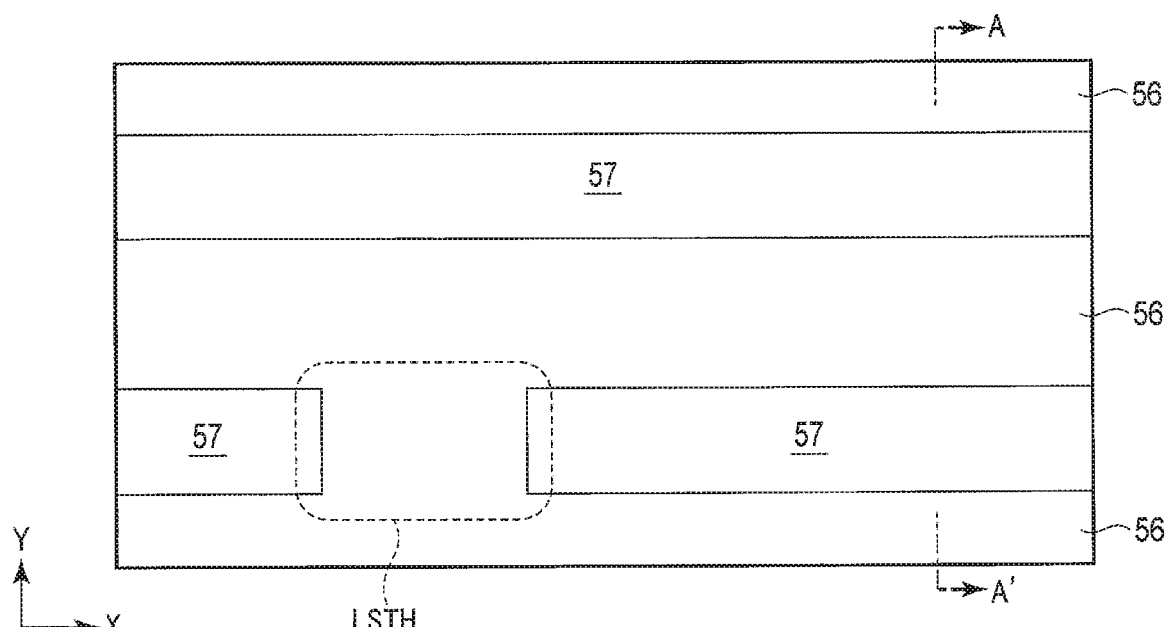
F I G. 26
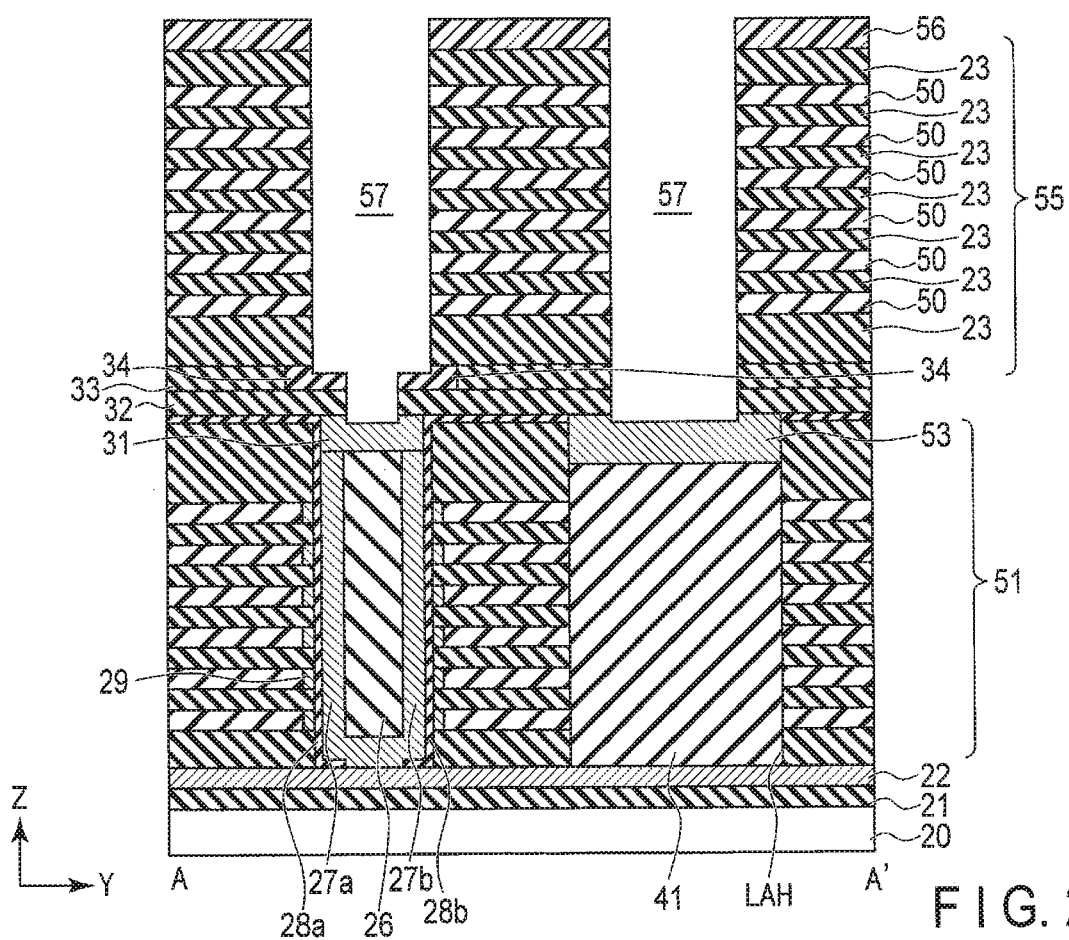
F I G. 27

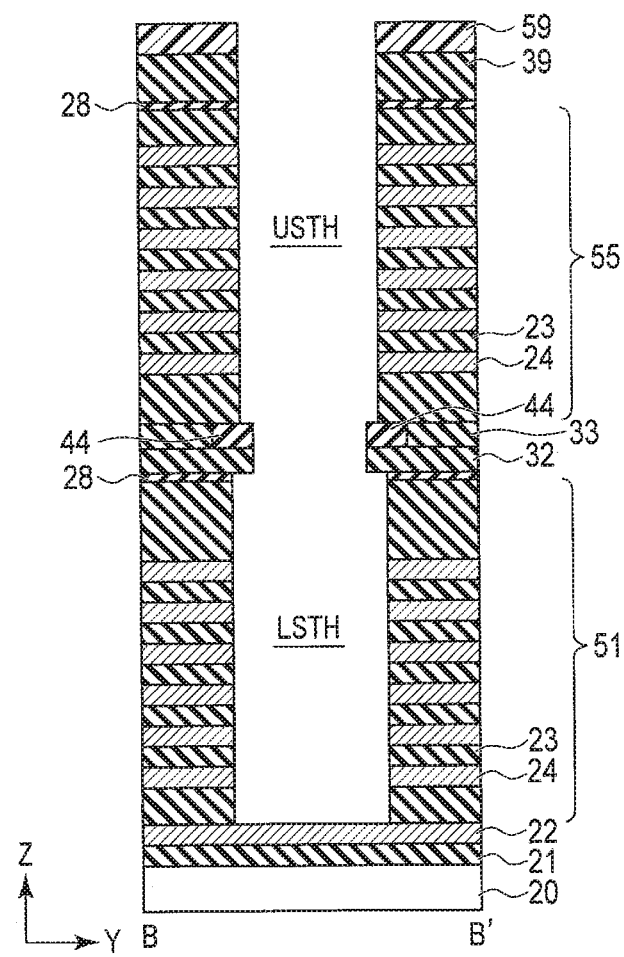
F I G. 36

SEMICONDUCTOR MEMORY DEVICE

CROSS-REFERENCE TO RELATED APPLICATIONS

This application is based upon and claims the benefit of priority from Japanese Patent Application No. 2018-163559, filed Aug. 31, 2018, the entire contents of which are incorporated herein by reference.

FIELD

The embodiments of the present invention relate generally to a semiconductor memory device.

BACKGROUND

A NAND flash memory is known as a kind of semiconductor memory device. A NAND flash memory comprising three-dimensionally stacked memory cell transistors is also known.

BRIEF DESCRIPTION OF THE DRAWINGS

FIG. 2 is a circuit diagram of one block BLK included in a memory cell array;

FIG. 5 is a sectional view of the memory cell array 10 taken along line B-B' of FIG. 3;

FIG. 14 is a sectional view illustrating the method of manufacturing the memory cell array;

FIG. 15 is a plan view illustrating the method of manufacturing the memory cell array;

FIG. 20 is a plan view illustrating the method of manufacturing the memory cell array;

FIG. 21 is a sectional view illustrating the method of manufacturing the memory cell array;

FIG. 26 is a plan view illustrating the method of manufacturing the memory cell array;

FIG. 27 is a sectional view illustrating the method of manufacturing the memory cell array;

FIG. 36 is a sectional view illustrating the method of manufacturing the memory cell array.

DETAILED DESCRIPTION

Figure 1:
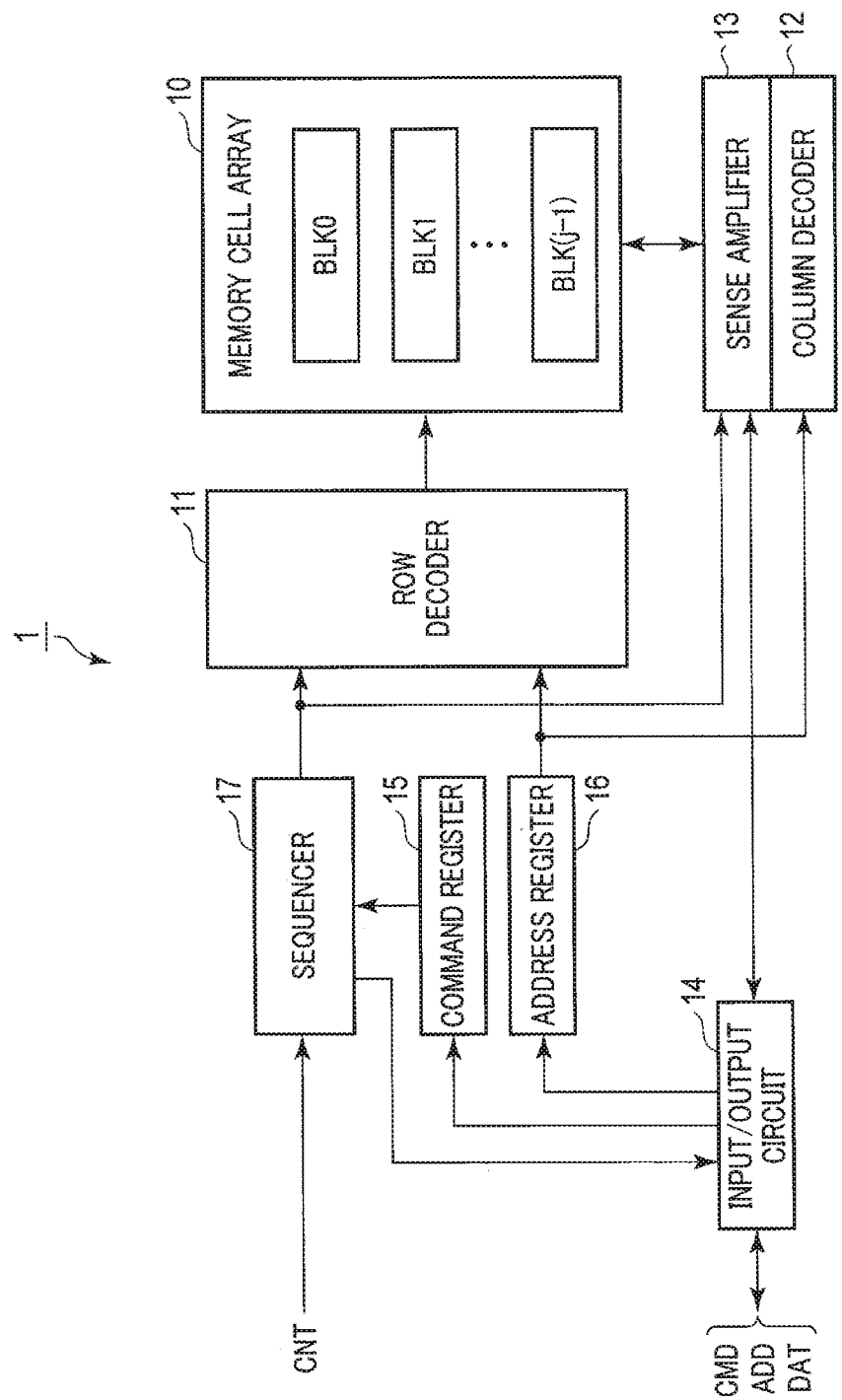
FIG. 1 is a block diagram illustrating a semiconductor memory device 1 according to an embodiment.

In general, according to one embodiment, there is provided a semiconductor memory device comprising:

a first stacked body including: a first semiconductor layer extending in a first direction; a plurality of first wiring layers arranged apart from each other along the first direction; a first memory film provided between the first semiconductor layer and the first wiring layers; a second semiconductor layer extending in the first direction; a plurality of second wiring layers arranged apart from each other along the first direction; a second memory film provided between the second semiconductor layer and the second wiring layers; and a first insulating layer provided between the first semiconductor layer and the second semiconductor layer;

a joining member provided on the first semiconductor layer, the second semiconductor layer, and the first insulating layer and made of a conductive material;

a first layer provided above the joining member and covering the first semiconductor layer and the first memory film in plan view;

a second layer provided above the joining member, located away from the first layer as viewed in a second direction perpendicular to the first direction, and covering the second semiconductor layer and the second memory film in plan view;

a second stacked body including: a third semiconductor layer arranged above the first layer and extending in the first direction; a plurality of third wiring layers arranged apart from each other along the first direction; a third memory film provided between the third semiconductor layer and the third wiring layers; a fourth semiconductor layer arranged above the second layer and extending in the first direction; a plurality of fourth wiring layers arranged apart from each other along the first direction; a fourth memory film provided between the fourth semiconductor layer and the fourth wiring layers; and a second insulating layer provided between the third semiconductor layer and the fourth semiconductor layer; and a fifth semiconductor layer provided between the first layer and the second layer, electrically connecting the third semiconductor layer and the fourth semiconductor layer to each other, and electrically connected to the joining member.

A description will now be given of the embodiments with reference to the accompanying drawings. Several embodiments described below merely show exemplary apparatuses and methods that implement the technical ideas of the present invention. The technical ideas are not limited by the element shapes, structures, arrangements etc. described below. It should be noted that the drawings are schematic or conceptual, and the relationships between the thickness and the width of each part and the proportions between the parts are not necessarily the same as the actual ones. Where the same portion is depicted in different drawings, the dimensions and proportions of one drawing may be different from those of another. In the description below, elements having the same functions and configurations will be denoted by the same reference symbols, and a detailed description of such elements will be omitted. A description will be given of different portions.

[1] Configuration of Semiconductor Memory Device 1

[1-1] Overall Configuration of Semiconductor Memory Device 1

An overall configuration of a semiconductor memory device 1 will be described. The semiconductor memory device according to the present embodiment is a NAND flash memory capable of storing data in a nonvolatile manner. FIG. 1 is a block diagram illustrating the semiconductor memory device 1 according to the embodiment.

The semiconductor memory device 1 comprises a memory cell array 10, a row decoder 11, a column decoder 12, a sense amplifier 13, an input/output circuit 14, a command register 15, an address register 16, a sequencer (control circuit) 17, etc.

The memory cell array 10 includes j blocks BLK0 to BLK(j−1). j is an integer not less than 1. Each of the blocks is provided with a plurality of memory cell transistors. The memory cell transistors are made of electrically rewritable memory cells. A plurality of bit lines, a plurality of word lines and a source line are arranged in the memory cell array 10 so as to control the voltages applied to the respective memory cell transistors. A specific configuration of blocks BLK will be described later.

The row decoder 11 receives a row address from the address register 16 and decodes this row address. The row decoder 11 performs a selection operation of, for example, word lines, based on the decoded row address. The row decoder 11 transfers the voltages required for the write operation, read operation and erase operation to the memory cell array 10.

The column decoder 12 receives a column address from the address register 16 and decodes this column address. The column decoder 12 performs a selection operation of bit lines, based on the decoded column address.

In a read operation, the sense amplifier 13 senses and amplifies data that is read from a memory cell transistor to a bit line. In a write operation, the sense amplifier 13 transfers write data to a bit line.

The input/output circuit 14 is connected to an external device (host device) via a plurality of input/output lines (DQ lines). The input/output circuit 14 receives command CMD and address ADD from the external device. The command CMD received by the input/output circuit 14 is sent to the command register 15. The address ADD received by the input/output circuit 14 is sent to the address register 16. Further, the input/output circuit 14 exchanges data DAT with reference to the external device.

The sequencer 17 receives control signals CNT from the external device. The control signals CNT include a chip enable signal CEn, a command latch enable signal CLE, an address latch enable signal ALE, a write enable signal WEn, a read enable signal REn, and the like. The "n" suffixed to the signal names indicates an active row. The sequencer 17 controls the operation of the entire semiconductor memory device 1 based on the commands CMD and control signals CNT stored in the command register 15.

[1-2] Circuit Configuration of Memory Cell Array 10

Next, a circuit configuration of the memory cell array 10 will be described. FIG. 2 is a circuit diagram of one of the blocks BLK included in the memory cell array 10.

Each of the blocks BLK is provided with a plurality of string units SU. In FIG. 2, four string units SU0 to SU3 are shown by way of example. The number of string units SU included in one block BLK can be optionally determined.

Each of the string units SU is provided with a plurality of memory groups MG. Each of the memory groups MG includes two NAND strings NSa and NSb connected in parallel.

NAND string NSa includes a plurality of memory cell transistors MTa and two select transistors STa1 and STa2. The memory cell transistors MTa are connected in series between the source of select transistor STa1 and the drain of select transistor STa2. In the present specification, the memory cell transistors may be referred to as memory cells or cells. For the sake of simplicity, FIG. 2 shows a configuration example in which NAND string NSa is provided with eight memory cell transistors MTa (MTa0 to MTa7), but the number of memory cell transistors MTa provided in NAND string NSa can be optionally determined.

Like NAND string NSa, NAND string NSb includes a plurality of memory cell transistors MTb (e.g., NTb0 to MTb7) and two select transistors STb1 and STb2. Where NAND strings NSa and NSb do not have to be distinguished, they will be denoted by the symbol "NS" without "a" or "b" in the present specification, and the explanation regarding the symbol "NS" are applicable to both NAND strings NSa and NSb. This holds true of the other symbols to which "a" and "b" are added.

Each of the memory cell transistors MT includes a control gate and a charge storage layer, and holds data in a nonvolatile manner. Memory cell transistor MTa may be a metal-oxide-nitride-oxide-silicon (MONOS) type wherein a charge storage layer uses an insulating film; alternatively, it may be a floating gate (FG) type wherein a charge storage layer uses a conductive film. In connection with the present embodiment, the FG type will be described as an example.

The gates of select transistors STa1 of string unit SU0 are commonly connected to select gate line SGDa0, and the gates of select transistors STb1 of string units SU0 are commonly connected to select gate line SGSb0. The gates of select transistors STa2 of string unit SU0 are commonly connected to select gate line SGSa, and the gates of select transistors STb2 of string unit SU0 are connected to select gate line SGSb. Likewise, select gate lines SGDa1 to SGDa3, select gate lines SGDb1 to SGDb3, select gate line SGSa, and select gate line SGSb are connected to string unit SU1 to SU3, respectively.

The control gates of memory cell transistors MTa0 to MTa7 of the same block BLK are connected to word lines WLa0 to WLa7, respectively. The control gates of memory cell transistors MTb0 to MTb7 of the same block BLK are connected to word lines WLb0 to WLb7, respectively.

Block BLK is, for example, an erasion unit of data, and the data held in memory cell transistors MT included in the same block BLK are erased at a time.

In the memory cell array 10, the drains of select transistors STa1 and STb1 included in the memory groups MG of the same column are commonly connected to any of bit lines BL0 to BL(m−1). "m" is an integer not less than 1. That is, bit line BL connects the memory groups MG in common, between a plurality of string units SU. The sources of select transistors ST2 are commonly connected to source line SL.

That is, string unit SU includes a plurality of NAND strings NS connected to different bit lines BL and connected to the same select gate line SGD. The block BLK includes a plurality of string units SU that share the word lines WL. The memory cell array 10 includes a plurality of blocks BLK that share the bit lines BL. In the memory cell array 10, select gate line SGS, a plurality of word lines WL, and select gate line SGD are stacked above the semiconductor substrate, whereby the select transistor ST2, a plurality of memory cell transistors MT, and select transistor ST1 are stacked in three dimensions.

[1-3] Configuration of Memory Cell Array 10

Figure 3:
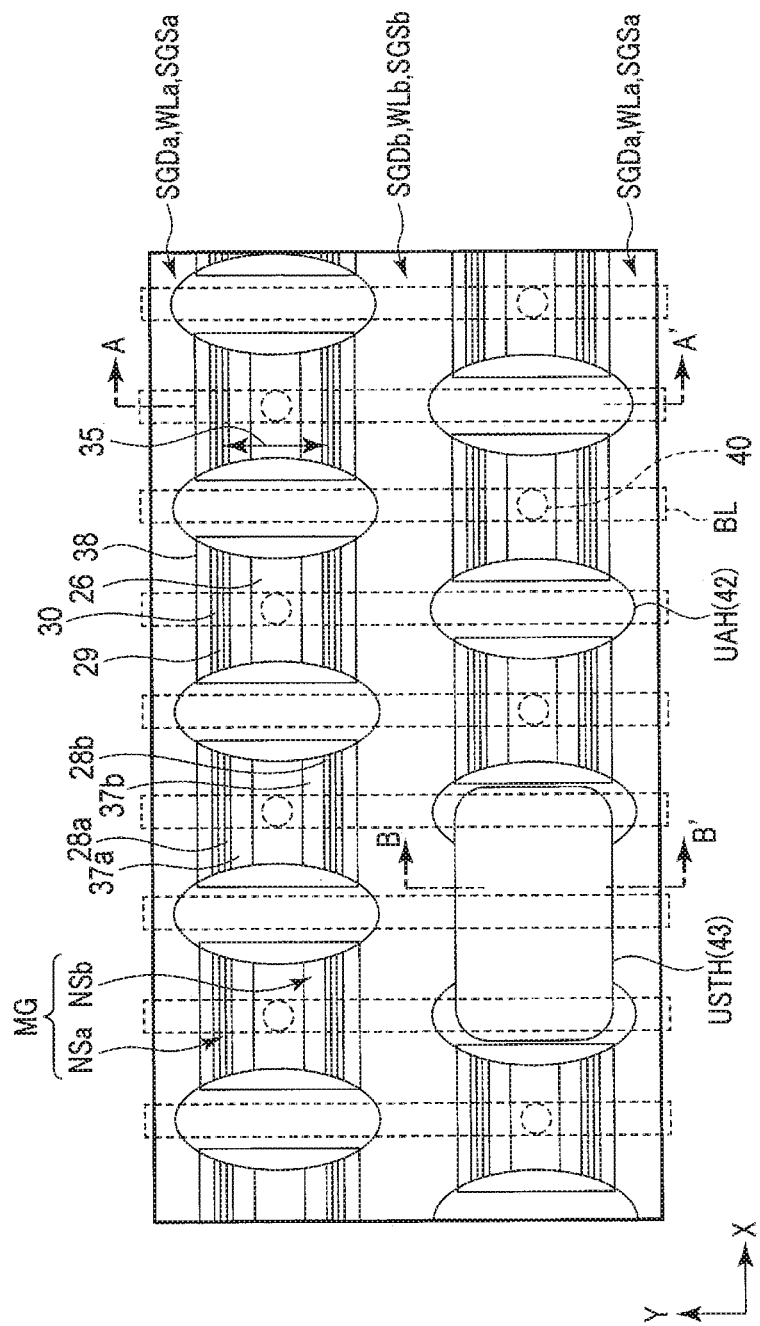
FIG. 3 is a plan view illustrating a partial region of the memory cell array.
Figure 4:
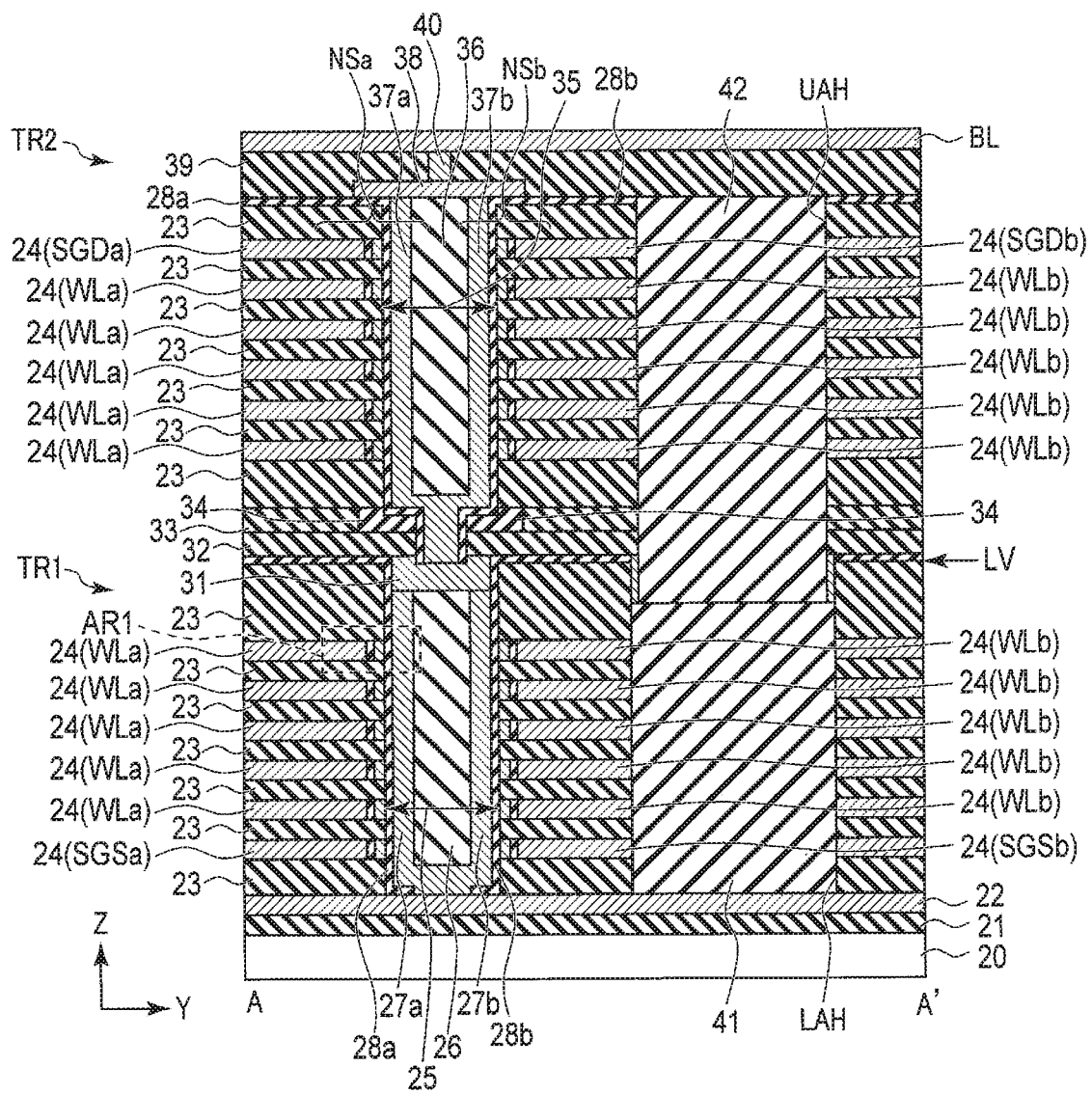
FIG. 4 is a sectional view of the memory cell array 10 taken along line A-A' of FIG. 3.

Next, a configuration of the memory cell array 10 (specifically, one of the blocks BLK included in the memory cell array 10) will be described. FIG. 3 is a plan view illustrating a partial region of the memory cell array 10. FIG. 4 is a sectional view of the memory cell array 10 taken along line A-A' of FIG. 3. FIG. 5 is a sectional view of the memory cell array 10 taken along line B-B' of FIG. 3. In the present specification, the X direction is a direction in which the select gate lines extend, the Y direction perpendicular to the X direction in a horizontal plane is a direction in which the bit lines extend, and the Z direction is a stacking direction.

On a substrate (for example, a silicon substrate) 20, an insulating layer 21 made of, for example, silicon oxide ($SiO_2$) and a conductive layer 22 made of, for example, polycrystalline silicon are stacked in this order. The conductive layer 22 functions as a source line SL. The source line SL is formed such that it spreads over the XY plane. The source line SL may be formed of a laminated film in which a conductive layer made of polycrystalline silicon, a metal layer made of, for example, tungsten (W) and a conductive layer made of polycrystalline silicon are stacked in this order.

A plurality of memory groups MG are provided on the conductive layer 22. The memory groups MG corresponding to one row along the X direction are electrically isolated by a plurality of insulating layers 41 and a plurality of insulating layers 42. Insulating layers 41 and 42 are stacked in this order. The planar shape of the insulating layers 41 and 42 is, for example, an ellipse. Insulating layers 41 and 42 are made of silicon oxide, for example. Insulating layers 41 are provided in opening LAH formed in the manufacturing process to be described later. Insulating layers 42 are provided in opening UAH formed in the manufacturing process to be described later.

The memory groups MG of the first row and the memory groups MG of the second row adjacent to the first row in the Y direction are arranged such that they are shifted from each other by a half pitch. Each memory group MG includes a first NAND string NSa and a second NAND string NSb adjacent to the first NAND string NSa in the Y direction. The memory groups MG are arranged in the X direction. The first memory group MG, the second memory group MG, and the third memory group MG are arranged adjacent to one another in the X direction. In the X direction, the fourth memory group MG of the second row is located between the first memory group MG and the second memory group MG, and in the Y direction, it is arranged at a different position from those of the first memory group MG and the second memory group MG. The first opening UAH of the first row is provided between the first memory group MG and the second memory group MG. The second opening UAH is provided between the second memory group MG and the third memory group MG. In the X direction, the third opening UAH of the second row is located between the first opening UAH and the second opening UAH, and in the Y direction, it is arranged at a different position from those of the first opening UAH and the second opening UAH.

The memory group MG is included in a first stacked body TR1 and a second stacked body TR2, which are stacked on the conductive layer 22.

Figure 6:
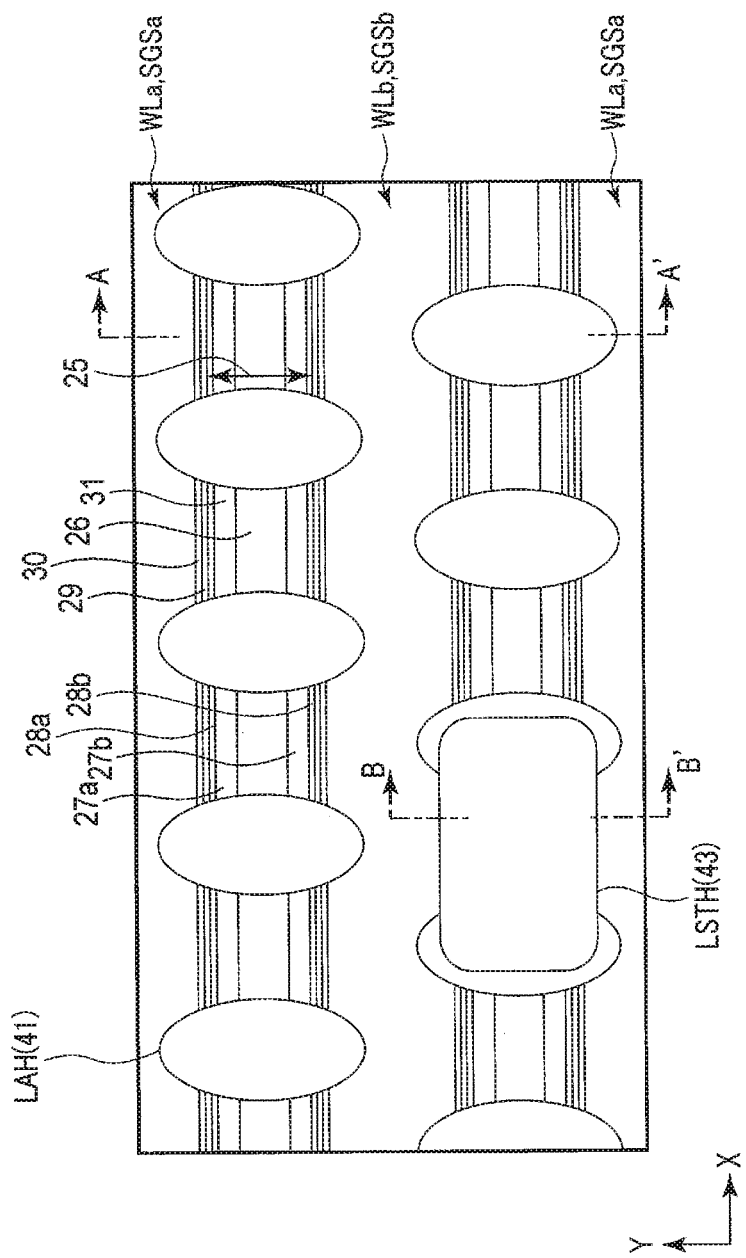
FIG. 6 is a plan view of a first stacked body shown in FIG. 4.

The first stacked body TR1 is configured as described below. FIG. 6 is a plan view of the first stacked body TR1, and is a plan view taken at position LV in the sectional view shown in FIG. 4.

Above the conductive layer 22, for example, a single wiring layer 24 functioning as select gate lines SGS (SGSa and SGSb) and a plurality of wiring layers 24 functioning as word lines WL (WLa and WLb) are stacked in this order, with respective interlayer insulating layers 23 interposed. The interlayer insulating layers 23 are made of silicon oxide, for example. The number of stacked word lines WL shown in FIG. 4 is just an example, and a larger number of word lines WL are stacked in practice. The select gate lines SGS are not limited to those formed by one layer, and may be formed with three wiring layers 24, for example.

Semiconductor layers 27a and 27b extending in the Z direction are provided on the conductive layer 22. Semiconductor layer 27a is a region where the channel of memory cell transistor MTa is formed. Semiconductor layer 27b is a region where the channel of memory cell transistor MTb is formed. Semiconductor layers 27a and 27b are connected, for example, at their lower end portions, and the lower end portions are electrically connected to the conductive layer 22. Semiconductor layers 27a and 27b are formed of, for example, polycrystalline silicon.

A core layer 26 is provided between semiconductor layer 27a and semiconductor layer 27b. The core layer 26 electrically isolates semiconductor layer 27a and semiconductor layer 27b in the Y direction. The core layer 26 is made of silicon oxide, for example.

Tunnel insulating film 28a is provided between semiconductor layer 27a and wiring layers 24 and between semiconductor layer 27a and the interlayer insulating layers 23. Tunnel insulating film 28a is formed to extend in the Z direction, and is provided in common to select transistor STa2 and memory cell transistors MTa. Tunnel insulating film 28b is provided between semiconductor layer 27b and wiring layers 24 and between semiconductor layer 27b and the interlayer insulating layers 23. Tunnel insulating film 28b is formed to extend in the Z direction, and is provided in common to select transistor STb2 and memory cell transistors MTb. In the example shown in FIG. 4, tunnel insulating films 28a and 28b are also formed on the uppermost interlayer insulating layer 23 included in the first stacked body TR1. Tunnel insulating films 28a and 28b are made of silicon oxide, for example.

Figure 7:
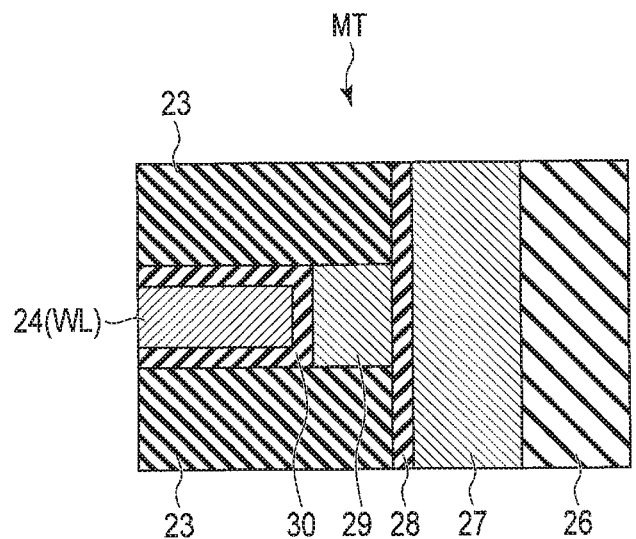
FIG. 7 is a sectional view of an extracted memory cell transistor.

FIG. 7 is a sectional view showing one memory cell transistor MT, and is a sectional view taken in region AR1 indicated by a square in the sectional view shown in FIG. 4. The configurations of memory cell transistors MTa and MTb and select transistors STa1, STb1, STa2, and STb2 are similar to those shown in FIG. 7.

A floating gate electrode (charge storage layer) 29 is provided between tunnel insulating film 28 and wiring layer 24. The floating gate electrode 29 is provided for each memory cell transistor MT and is insulated from its surroundings. The floating gate electrode 29 is made of a conductive member that accumulates charges, and is made of polycrystalline silicon, for example.

A block insulating film 30 is provided between the floating gate electrode 29 and wiring layer 24. The block insulating film 30 is made of a high dielectric constant film. The block insulating film 30 is, for example, a laminated film in which a first film made of hafnium oxide ($HfO_2$), a second film made of silicon oxide, and a third film made of hafnium oxide are stacked in this order.

The block insulating film 30 is in contact with wiring layer 24. Wiring layer 24 functions as word line WL. Wiring layer 24 includes, for example, a barrier metal film which covers the upper surface, side surface and bottom surface of wiring layer 24. The main body of the control gate electrode 24 is made of tungsten (W), for example, and the barrier metal film is made of titanium nitride (TiN), for example. In the example shown in FIG. 7, the block insulating film 30 is formed on the upper surface, the side surface, and the bottom surface of the control gate electrode 24.

In the present specification, the laminated film provided between the semiconductor layer 27 and the control gate electrode 24, namely, the tunnel insulating film 28, the floating gate electrode (charge storage layer) 29, and the block insulating film 30 may be collectively referred to as a memory film.

A joining member 31 is provided on the core layer 26 and the semiconductor layers 27a and 27b. The joining member 31 has a function of electrically connecting the semiconductor layers (channels) of the first stacked body TR1 and the semiconductor layers (channels) of the second stacked body TR2 to each other. In addition, as will be described later, the joining member 31 functions as an etching stopper when a laminated film including interlayer insulating layers made of silicon oxide is etched. The joining member 31 is formed of a conductive material that has a high etching selection ratio with respect to the interlayer insulating layers made of silicon oxide. The joining member 31 is formed of amorphous silicon, for example.

The first stacked body TR1 is formed in the manner mentioned above. The first stacked body TR1 is a structure including the substrate 20 to the joining member 31.

An insulating layer 32 is provided on the joining member 31 and the tunnel insulating films 28a and 28b. The insulating layer 32 is made of silicon oxide, for example.

A plurality of cover layers 34 are provided on the insulating layer 32. Each cover layer 34 has an area capable of covering a cell region (the semiconductor layer 27, the tunnel insulating film 28, the floating gate electrode 29, and the block insulating film 30) in plan view. The cover layers 34 are provided for the respective semiconductor layers 27. The cover layers 34 are formed of a conductive material that has a high etching selection ratio with respect to interlayer insulating layers made of silicon oxide. The cover layers 34 are formed of amorphous silicon, for example. The cover layers 34 are members used in the manufacturing method to be described later, and details thereof will be described later.

An insulating layer 33 is provided around the cover layers 34. The insulating layer 33 is made of silicon oxide, for example.

The second stacked body TR2 is provided on the insulating layer 33 and the cover layers 34. The second stacked body TR2 is configured as follows.

On the insulating layer 33 and the cover layers 34, a plurality of wiring layers 24 functioning as word lines WL (WLa and WLb) and one wiring layer 24 functioning as select gate lines SGD (SGDa and SGDb) are stacked in this order, with respective interlayer insulating layers 23 interposed. The number of stacked word lines WL shown in FIG. 4 is just an example, and a larger number of word lines WL are stacked in practice. The select gate lines SGS are not limited to those formed by one layer, and may be formed with three wiring layers 24, for example.

Memory cell transistors MTa and MTb and select transistors STa1 and STb1, namely the upper half of memory group MG, are provided in opening 35 having a substantially rectangular shape. Semiconductor layers 37a and 37b extending in the Z direction are provided on the joining member 31. Semiconductor layer 37a is a region where the channel of memory cell transistor MTa is formed. Semiconductor layer 37b is a region where the channel of memory cell transistor MTb is formed. Semiconductor layers 37a and 37b are connected at their lower end portions, and the lower end portions are electrically connected to the joining member 31. Semiconductor layers 37a and 37b are formed of polycrystalline silicon, for example.

A core layer 36 is provided between semiconductor layer 37a and semiconductor layer 37b. The core layer 36 electrically isolates semiconductor layer 37a and semiconductor layer 37b in the Y direction. The core layer 36 is made of silicon oxide, for example.

As in the first stacked body TR1, a tunnel insulating film 28, a floating gate electrode 29, and a block insulating film 30 are provided on the side surfaces of the semiconductor layers 37.

A connection member 38 is provided on the semiconductor layers 37a and 37b and the core layer 36. The connection member 38 electrically connects semiconductor layer 37a and semiconductor layer 37b to each other. The connection member 38 is provided for each memory group MG. The connection member 38 is made of a conductive material, which is polycrystalline silicon, for example.

An insulating layer 39 is provided on the connection member 38 and the tunnel insulating film 28. The insulating layer 39 is made of silicon oxide, for example.

A contact plug 40 electrically connected to the connection member 38 is provided on the connection member 38 and inside the insulating layer 39. The contact plug 40 is formed of tungsten (W), for example.

A bit line BL electrically connected to the contact plug 40 is provided on the contact plug 40 and the insulating layer 39. Bit line BL extends in the Y direction. Bit line BL is formed of tungsten (W), for example.

As shown in FIGS. 3 and 5, the memory cell array 10 includes replacement holes LSTH and USTH in arbitrary regions. The replacement holes LSTH and USTH are used in the manufacturing process. The replacement holes LSTH and USTH are used for replacing sacrifice layers included in the first and second stacked bodies TR1 and TR2 with wiring layers. An insulating layer 43 is provided inside the replacement holes LSTH and USTH. The insulating layer 43 is made of silicon oxide, for example.

Replacement hole LSTH is provided in the first stacked body TR1. Replacement hole USTH is provided in the second stacked body TR2. The insulating layer 43 passes through the interlayer insulating layers 23, the wiring layers 24, and the tunnel insulating film 28, which are included in the first stacked body TR1. The insulating layer 43 passes through the insulating layers 32 and 33, the interlayer insulating layers 23, the wiring layers 24, the tunnel insulating film 28 and the insulating layer 39, which are included in the second stacked body TR2. The insulating layer 43 passes between the two cover layers 44 provided in the insulating layer 33. The cover layers 44 are made of the same material as the aforementioned cover layer 34. The cover layers 44 are members used in the manufacturing method to be described later, and details thereof will be described later.

Note that the plan view shown in FIG. 3 illustrates a configuration in which a plurality of memory groups MG are connected to a pair of select gate lines SDGa and SGDb. Actually, the configuration shown in FIG. 3 is repeated in the Y direction. In this case, select gate lines SDGa and SGDb are alternately arranged along the Y direction. In the memory cell array 10, a plurality of even-numbered word lines WLa and a plurality of odd-numbered word lines WLb are arranged such that the even-numbered word lines WLa are electrically connected to each other and the odd-numbered word lines WLb are electrically connected to each other. It should be noted that the odd-numbered word lines WLb and the even-numbered word lines WLa may be electrically connected to each other.

[2] Manufacturing Method of Memory Cell Array 10

Next, a method of manufacturing the memory cell array 10 will be described. FIGS. 8 to 36 are plan views and sectional views illustrating a method of manufacturing the memory cell array 10.

First of all, a silicon substrate 20 is prepared. Subsequently, an insulating layer 21 and a conductive layer 22 (source line SL) are formed in this order on the silicon substrate 20. The conductive layer 22 may be a laminated film in which a plurality of conductive layers are stacked. For example, the conductive layer 22 may be formed of a laminated film in which a conductive layer made of polycrystalline silicon, a metal layer made of tungsten (W), for example, and a conductive layer made of polycrystalline silicon are stacked in this order.

Subsequently, a plurality of interlayer insulating layers 23 and a plurality of sacrifice layers 50 are alternately stacked one by one on the conductive layer 22, for example, by CVD (chemical vapor deposition), thereby forming a laminated film 51. An interlayer insulating layer 23 is disposed on the lowermost layer of the laminated film 51 and on the uppermost layer of the laminated film 51. The interlayer insulating layers 23 are made of silicon oxide, for example. The sacrifice layers 50 are formed of silicon nitride (SiN), for example. The sacrifice layers 50 may be made of any material as long as it provides a sufficient wet etching selection ratio with respect to the interlayer insulating layers 23, and silicon oxynitride (SiON) or the like may be used.

Figure 8:
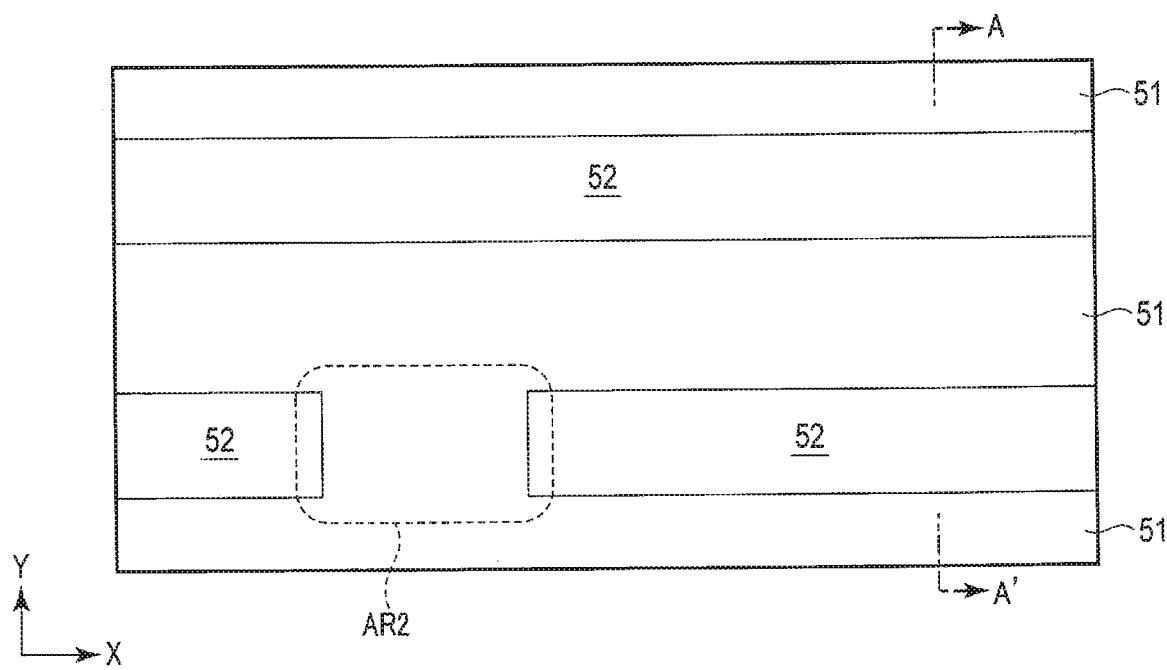
FIG. 8 is a sectional view of an extracted memory cell transistor MT.
Figure 9:
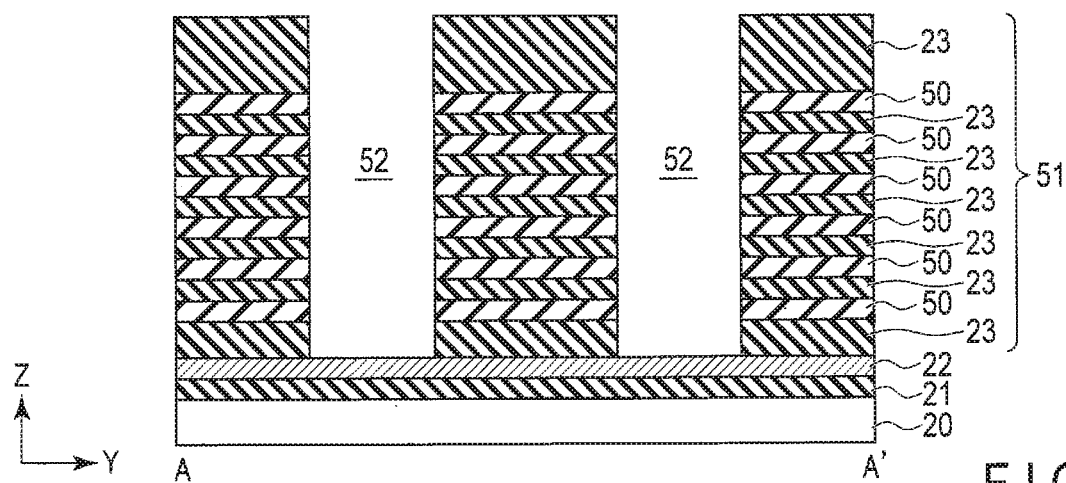
FIG. 9 is a plan view illustrating a method of manufacturing a memory cell array.

Subsequently, anisotropic etching such as reactive ion etching (RIE) is performed such that a plurality of memory trenches 52 each extending in the X direction are formed in the laminated film 51. The memory trenches 52 expose the conductive layer 22. The memory trenches 52 are regions where memory groups MG are to be formed. As shown in FIG. 8, no memory trench 52 is provided in area AR2 where the above-mentioned replacement holes LSTH and USTH are to be formed, and two laminated films 51 sandwiching area AR2 in the Y direction are connected together, with area AR2 interposed. By providing region AR2, the laminated films 51 are prevented from inclining or collapsing.

Figure 10:
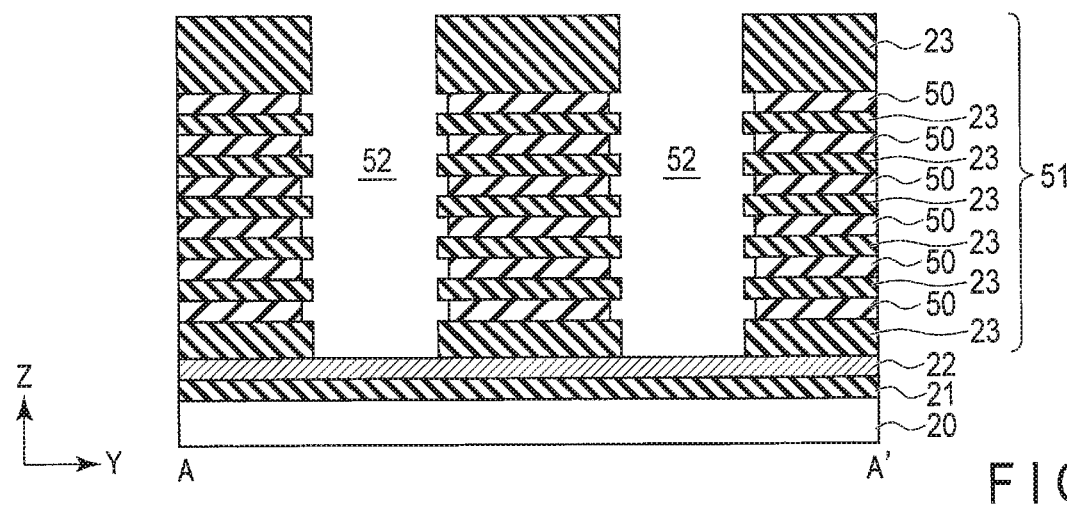
FIG. 10 is a sectional view illustrating the method of manufacturing the memory cell array.

Subsequently, as shown in FIG. 10, the sacrifice layers 50 are isotropically etched through the memory trenches 52. The isotropic etching is, for example, wet etching that uses phosphoric acid ($H_3PO_4$) as an etchant. As a result, the exposed surfaces of the sacrifice layers 50 facing the memory trenches 52 are recessed (the sacrifice layers 50 are recessed), and recessed portions are formed on the side surfaces of the memory trenches 52.

Figure 11:
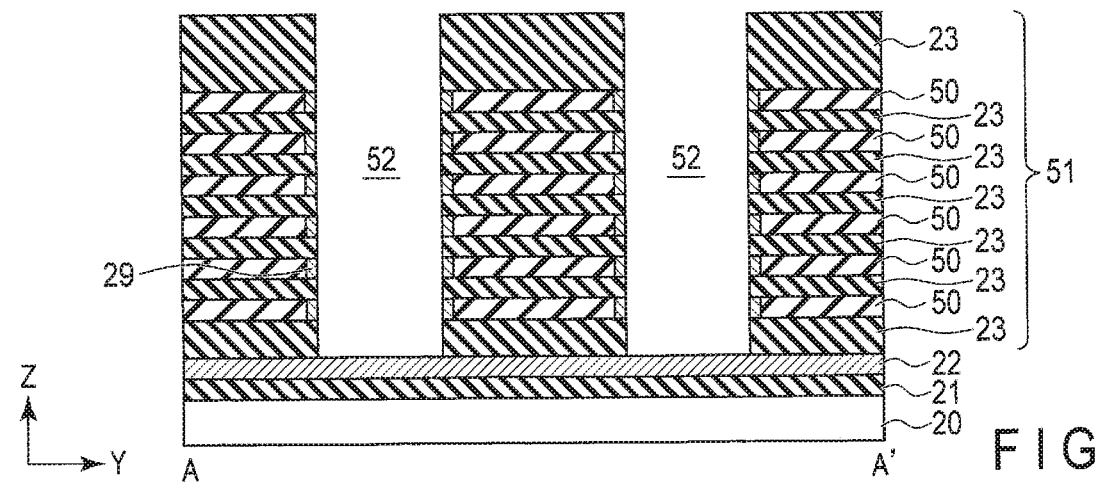
FIG. 11 is a sectional view illustrating the method of manufacturing the memory cell array.

Subsequently, as shown in FIG. 11, floating gate electrodes 29 are formed on the side surfaces of the sacrifice layers 50. Specifically, an amorphous silicon layer is deposited on the side surfaces of the memory trenches 52 by the CVD method, for example. At this time, the amorphous silicon layer fills the recesses formed in the side surfaces of the memory trenches 52. Subsequently, the amorphous silicon layer is etched back such that the amorphous silicon layer is left in the recessed portions and is removed from the side surfaces of the interlayer insulating layers 23.

Figure 12:
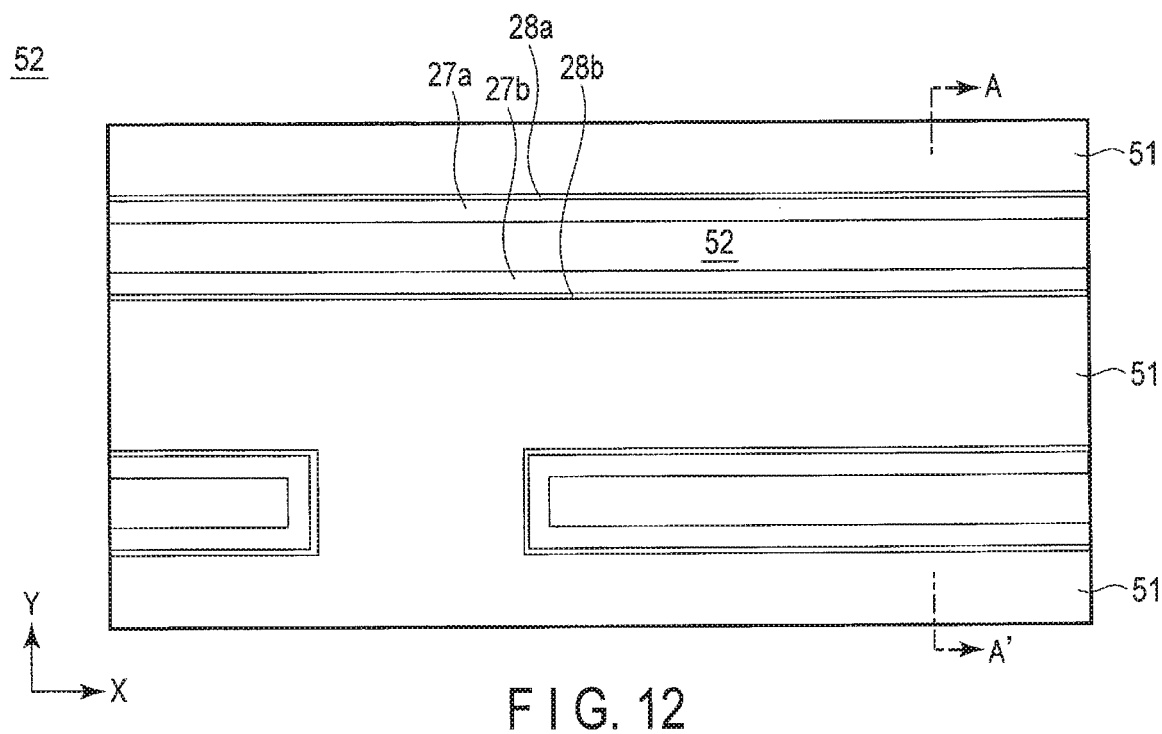
FIG. 12 is a plan view illustrating the method of manufacturing the memory cell array.
Figure 13:
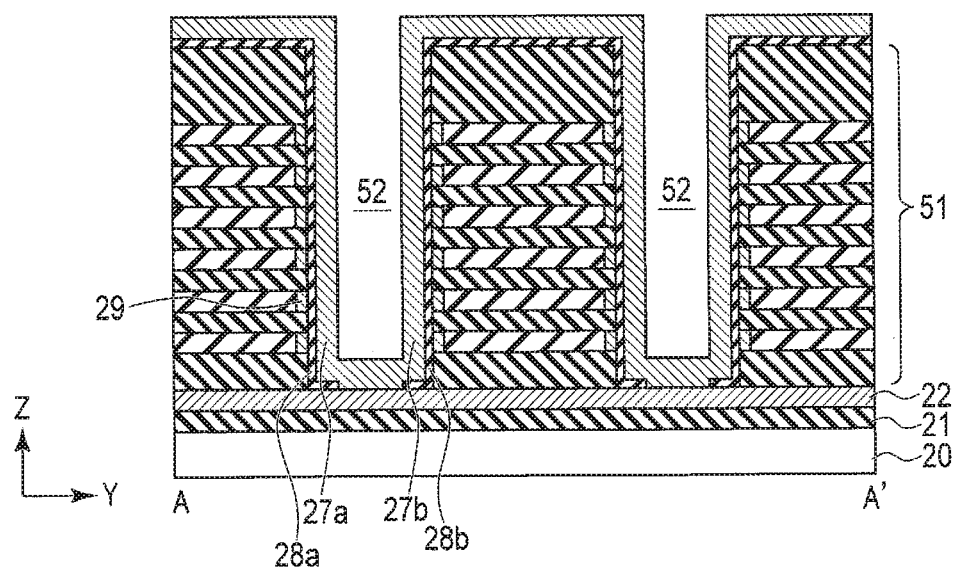
FIG. 13 is a sectional view illustrating the method of manufacturing the memory cell array.

Subsequently, as shown in FIGS. 12 and 13, a silicon oxide film is formed on the two side faces of each memory trench 52 by the CVD method, for example. In the plan view shown in FIG. 12, the layers formed on the side surfaces of the memory trench 52 is shown, and the layer formed on the uppermost interlayer insulating layer is not shown. As a result, tunnel insulating films 28 (28a and 28b) are formed on the side surfaces of the floating gate electrodes 29. Subsequently, the tunnel insulating films 28 formed on the conductive layer 22 is partially removed by anisotropic etching such as RIE.

Subsequently, an amorphous silicon layer is formed on the side surfaces of the tunnel insulating films 28a and 28b and on the exposed conductive layer 22 by the CVD method, for example. As a result, semiconductor layers 27a and 27b electrically connected to the conductive layer 22 are formed on the side surfaces of the tunnel insulating films 28a and 28b. The semiconductor layers 27a and 27b are connected to each other at their lower end portions.

Subsequently, as shown in FIG. 14, silicon oxide is filled in the memory trenches 52 by the CVD method, for example. As a result, a core layer 26 is formed between semiconductor layer 27a and semiconductor layer 27b.

Figure 16:
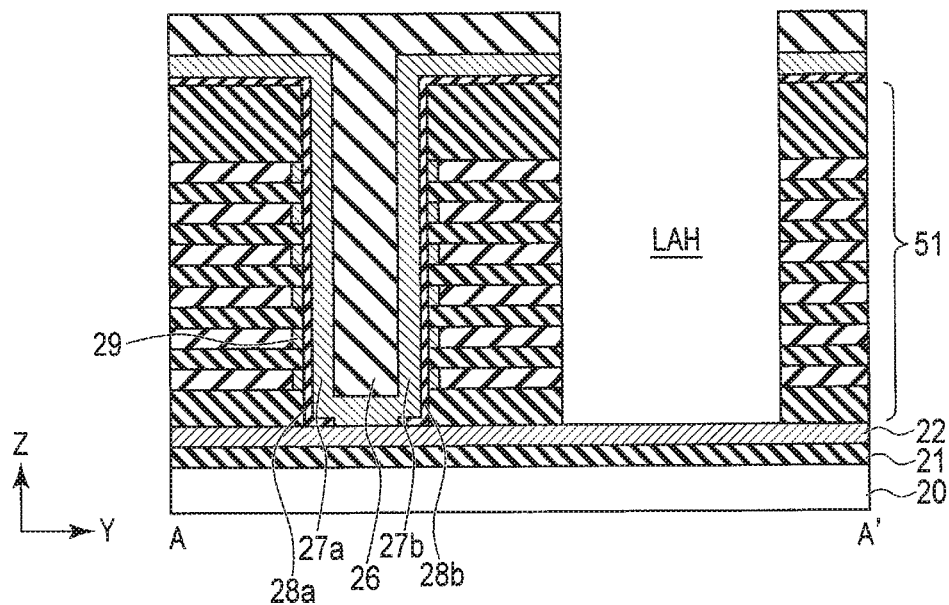
FIG. 16 is a sectional view illustrating the method of manufacturing the memory cell array.

Subsequently, as shown in FIGS. 15 and 16, a plurality of openings LAH reaching the conductive layer 22 are formed in the stacked body by RIE, for example, such that the semiconductor layers 27 formed in the memory trench 52 and the memory film (including the tunnel insulating film 28 and the floating gate electrode 29) are divided into a plurality of portions in the X direction. The length of each opening LAH as viewed in the Y direction is more than the width of memory trench 52 (including the region where the floating gate electrode 29 is formed). The openings LAH aligned in the X direction are arranged at regular intervals. The openings LAH aligned in the Y direction are arranged, for example, in a staggered fashion (a zigzag fashion). As a result, the semiconductor layers 27a and 27b and the floating gate electrodes 29 are separated for each memory group MG.

Figure 17:
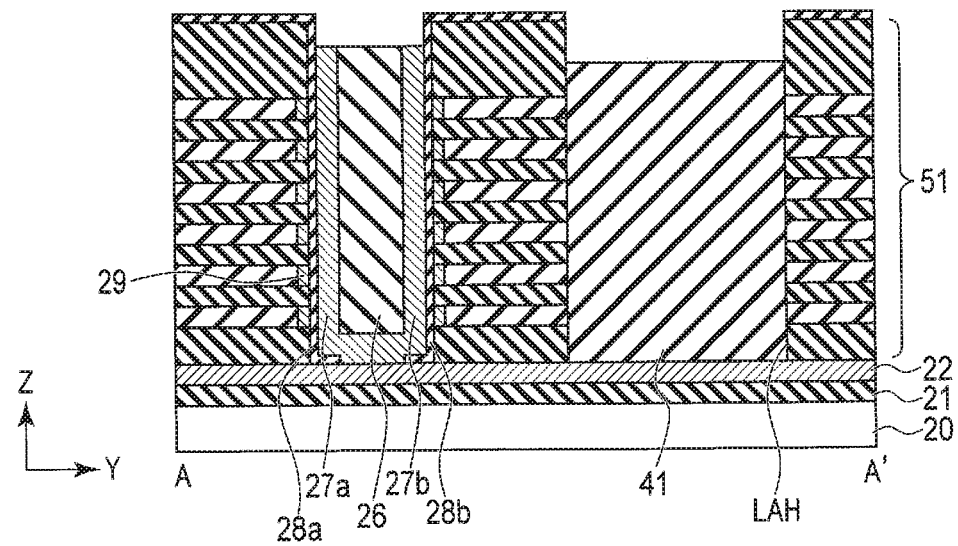
FIG. 17 is a sectional view illustrating the method of manufacturing the memory cell array.

Subsequently, as shown in FIG. 17, silicon oxide is filled in each opening LAH by the CVD method, for example. Thereby, an insulating layer 41 is formed in the opening LAH.

Subsequently, the core layer 26, the semiconductor layer 27, and the insulating layer 41 are etched back to a position lower than the upper surface of the laminated film 51. In addition, the upper surface of the insulating layer 41 is etched back to a position lower than the upper surface of the core layer 26 for the purpose of forming a thick stopper layer 53 described later.

Figure 18:
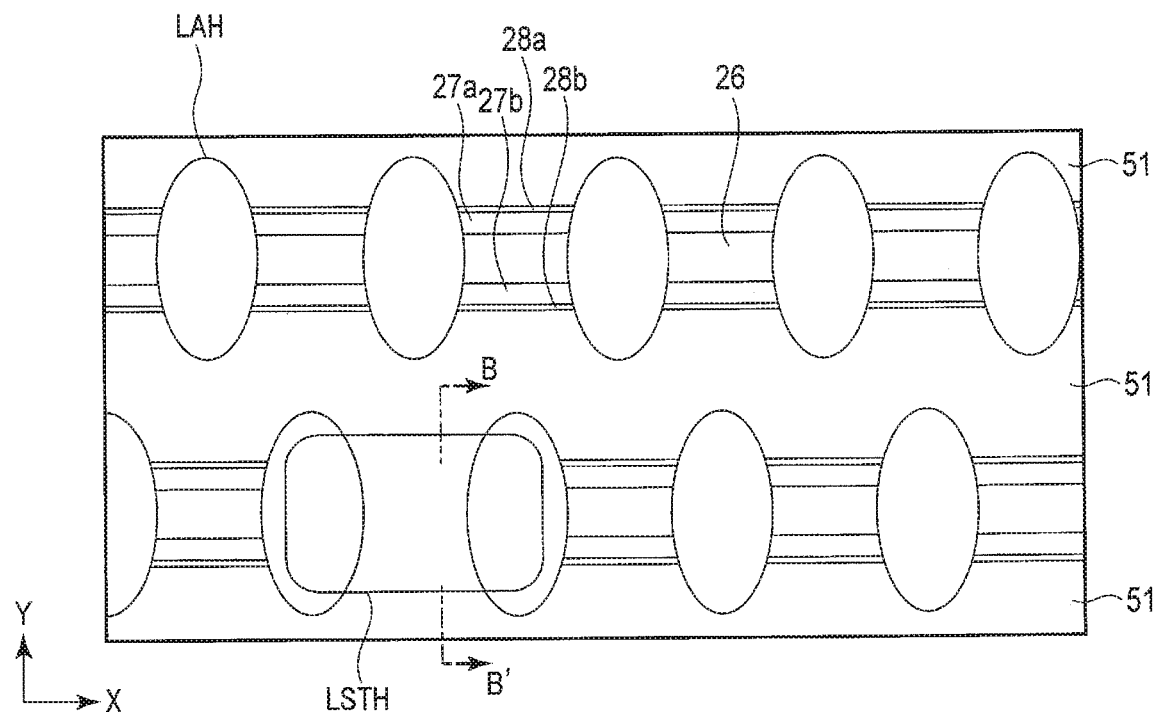
FIG. 18 is a plan view illustrating the method of manufacturing the memory cell array.
Figure 19:
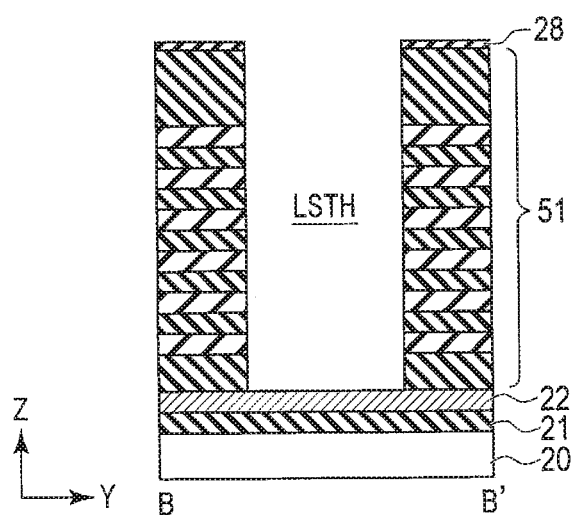
FIG. 19 is a sectional view illustrating the method of manufacturing the memory cell array.

Subsequently, as shown in FIGS. 18 and 19, an opening (a replacement hole) LSTH reaching the conductive layer 22 is formed in a predetermined region (region AR2 shown in FIG. 8) of the stacked body by RIE, for example. The length of the replacement hole LSTH as viewed in the X direction is more than the distance between two openings LAH adjacent in the X direction, and the length of the replacement hole LSTH as viewed in the Y direction is more than the width of the memory trench 52.

Figure 22:
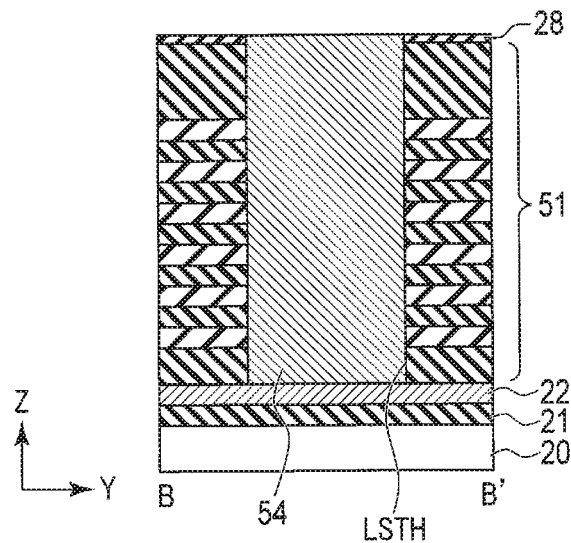
FIG. 22 is a sectional view illustrating the method of manufacturing the memory cell array.

Subsequently, as shown in FIGS. 20 and 21, amorphous silicon is deposited in the memory trench 52 by the CVD method, for example, and amorphous silicon is further filled in the opening LAH. As a result, a joining member 31 electrically connected to the semiconductor layers 27*a* and 27*b* is formed on the semiconductor layers 27*a* and 27*b* and the core layer 26. In addition, a stopper layer 53 is formed on the insulating layer 41. The thickness of the stopper layer 53 is set to be greater than the thickness of the joining member 31. Further, as shown in FIGS. 20 and 22, amorphous silicon is filled in the replacement hole LSTH. As a result, a sacrifice layer 54 is formed in the replacement hole LSTH. Subsequently, the joining member 31, the stopper layer 53, and the sacrifice layer 54 are made flat by performing, for example, CMP (chemical mechanical polishing), and the residual amorphous silicon layer is removed.

Figure 23:
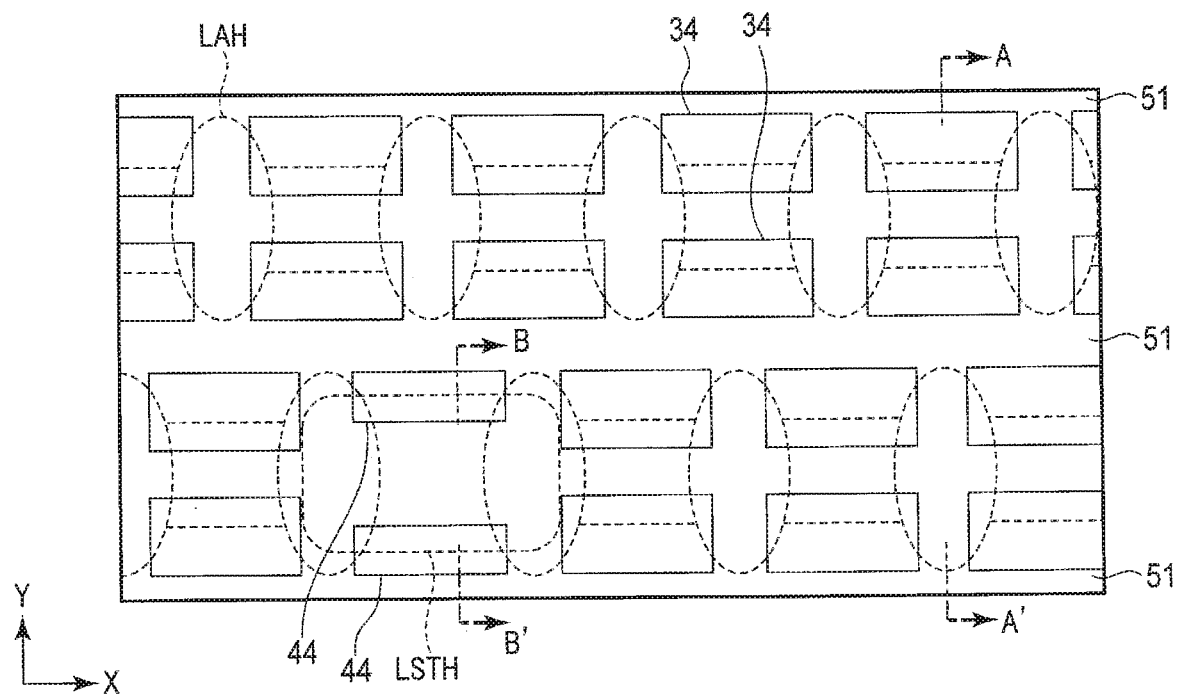
FIG. 23 is a plan view illustrating the method of manufacturing the memory cell array.
Figure 24:
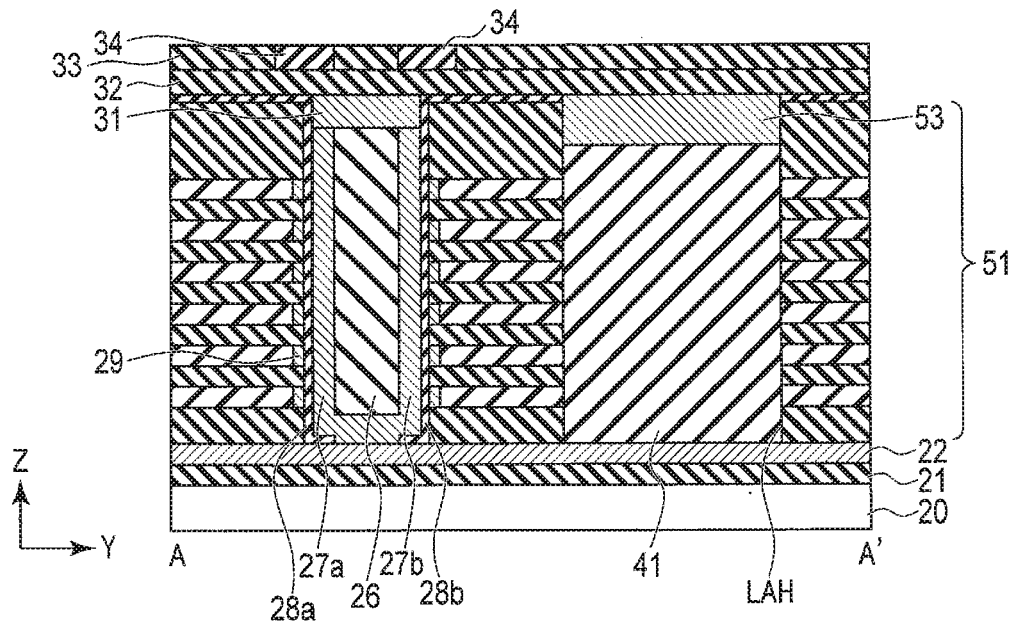
FIG. 24 is a sectional view illustrating the method of manufacturing the memory cell array.
Figure 25:
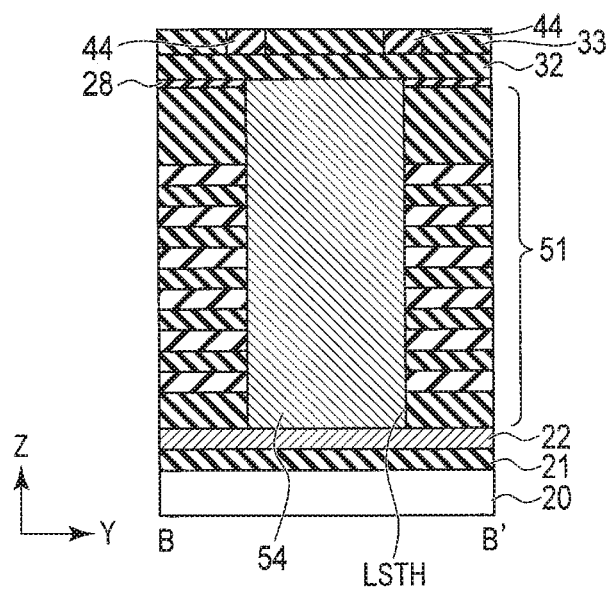
FIG. 25 is a sectional view illustrating the method of manufacturing the memory cell array.

Subsequently, as shown in FIGS. 23 and 24, an insulating layer 32 made of silicon oxide is formed on the entire surface of the stacked body by the CVD method, for example. Subsequently, a plurality of cover layers 34 made of amorphous silicon are formed by the CVD method and RIE such that the semiconductor layer 27, the tunnel insulating film 28, and the floating gate electrode 29 are covered in plan view. Further, as shown in FIGS. 23 and 25, two cover layers 44 made of amorphous silicon are formed by the CVD method and RIE, for example, such that the end portions of the replacement hole LSTH as viewed in the Y direction are covered in plan view. An insulating layer 33 made of silicon oxide is formed around the cover layers 34 and 44. Subsequently, the cover layers 34 and 44 and the insulating layer 33 are made flat by CMP (chemical mechanical polishing), for example.

Subsequently, as shown in FIGS. 26 and 27, a plurality of interlayer insulating layers 23 and a plurality of sacrifice layers 50 are alternately formed one by one on the cover layers 34 and 44 and the insulating layer 33 by the CVD method, for example, thereby forming a laminated film 55. An interlayer insulating layer 23 is disposed on the lowermost layer and uppermost layer of the laminated film 55.

Subsequently, a mask layer 56 for exposing regions where memory trenches 57 are to be formed is formed on the laminated film 55 by lithography. In plan view, the regions where the memory trenches 57 are formed are substantially at the same positions as the regions where the above-mentioned memory trenches 52 are formed. The replacement hole LSTH is covered with the mask layer 56.

Subsequently, memory trenches 57 reaching the joining member 31 and the stopper layer 53 are formed in the laminated film 55, for example, by RIE, using the mask layer 56 as a mask. The joining member 31 and the stopper layer 53 are also used as stoppers during the RIE. By this etching step, the cover layers 34 are exposed. The cover layers 34 are not completely removed, and the joining member 31 is exposed through the gap between the two cover layers 34 arranged in the Y direction. That is, the width of each opening portion on the joining member 31 is defined by the two cover layers 34, so that the widths of the opening portions can be made substantially the same. In addition, since the cover layer 34 protects the semiconductor layer 27 and the memory film (including the tunnel insulating film 28 and the floating gate electrode 29), the semiconductor layer 27 and the memory film are prevented from being partially etched in this etching step. Thereafter, the mask layer 56 is removed.

Figure 28:
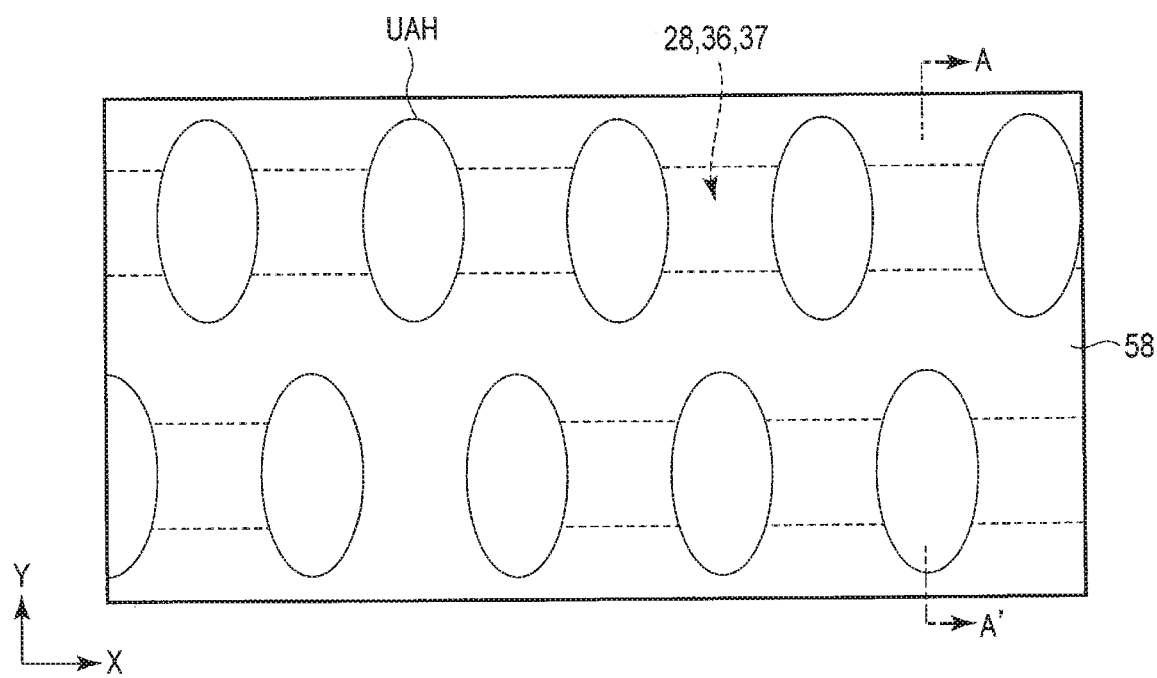
FIG. 28 is a plan view illustrating the method of manufacturing the memory cell array.
Figure 29:
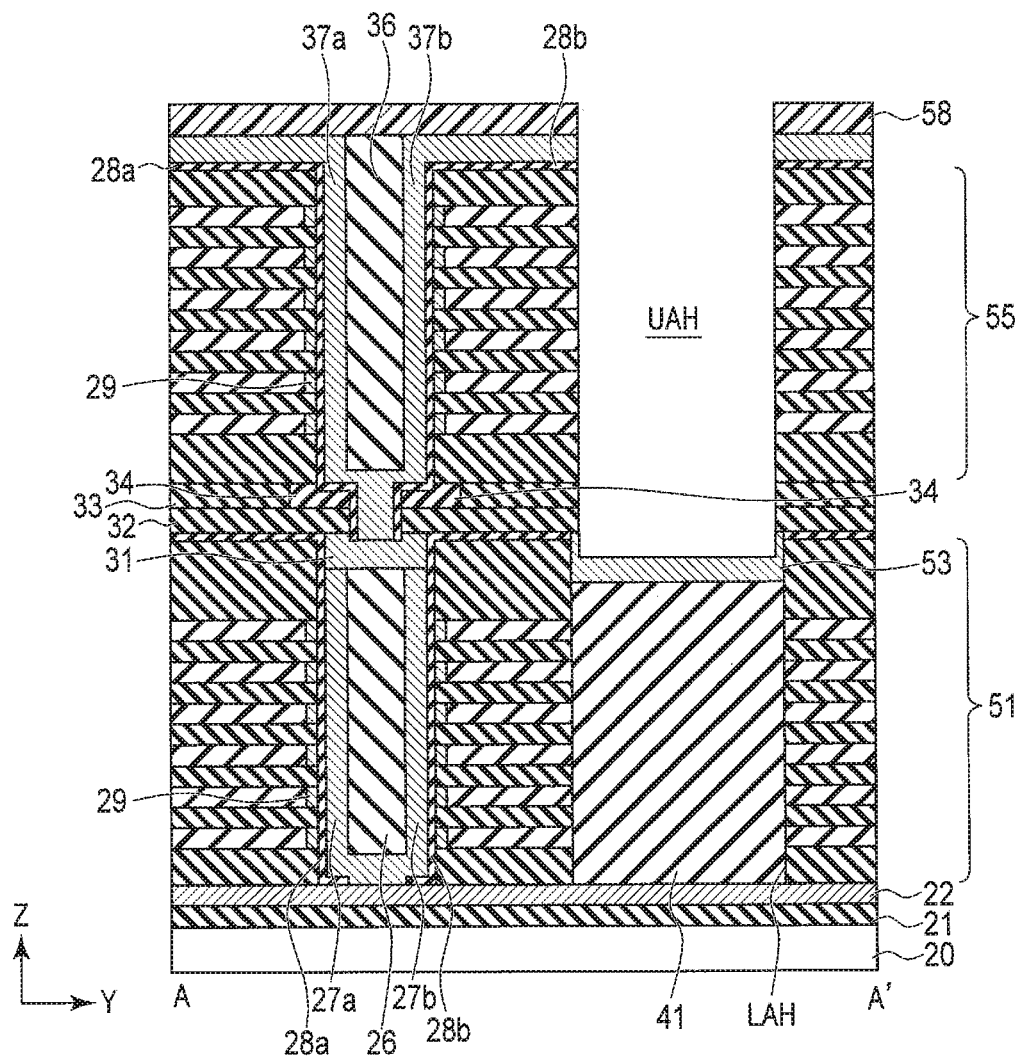
FIG. 29 is a sectional view illustrating the method of manufacturing the memory cell array.

Subsequently, as shown in FIGS. 28 and 29, a core layer 36, semiconductor layers 37*a* and 37*b*, tunnel insulating films 28*a* and 28*b*, and a floating gate electrode 29 are formed in each memory trench 57. The method of forming the core layer, the semiconductor layers, the tunnel insulating films, and the floating gate electrode is similar to that of the case where the first stacked body TR1 is formed. The semiconductor layers 37 and the tunnel insulating films 28 are formed on the laminated film 55 as well.

Semiconductor layers 37*a* and 37*b* are connected at their lower end portions, and the lower end portions are electrically connected to the joining member 31. The semiconductor layers 37*a* and 37*b* are connected to the joining member 31 through the gap between the two cover layers 34 aligned in the Y direction. The width of each semiconductor layer 37 on the joining member 31 is defined by the two cover layers 34 aligned in the Y direction. As a result, the widths of the lower end portions of the semiconductor layers 37 can be made substantially the same.

Subsequently, a mask layer 58 for exposing the region where the opening UAH is formed is formed on the semiconductor layer 37 and the core layer 36 by lithography. In plan view, the region where the opening UAH is formed is substantially at the same position as the region where the above-mentioned opening LAH is formed.

Subsequently, a plurality of openings UAH reaching the stopper layer 53 are formed in the stacked body, for example, by RIE that uses the mask layer 58 as a mask, such that the semiconductor layer 37 formed in the memory trench 57 and the memory film (including the tunnel insulating film 28 and the floating gate electrode 29) are divided into a plurality of portions in the X direction. The stopper layer 53 is also used as a stopper during RIE. As a result, the semiconductor layers 27*a* and 37*b* and the floating gate electrodes 29 are separated for each memory group MG.

Figure 30:
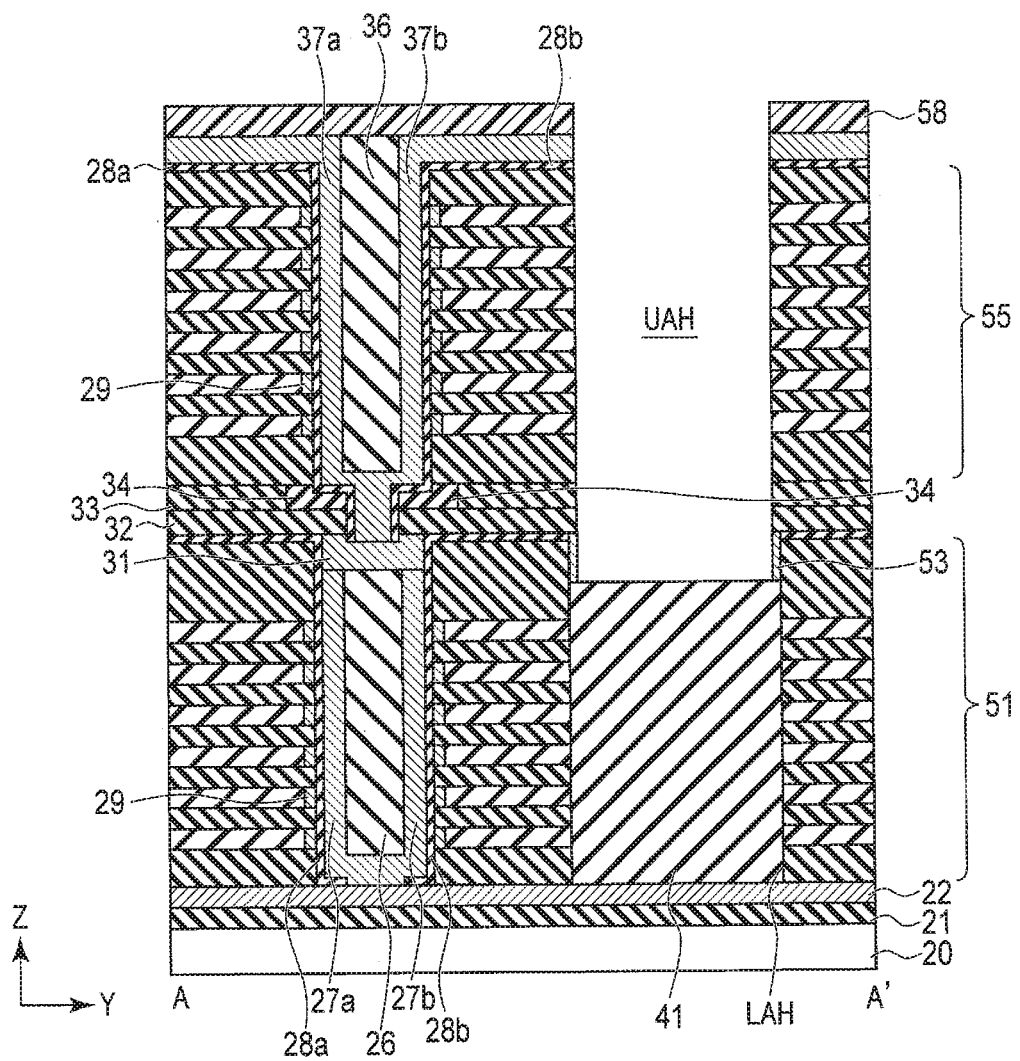
FIG. 30 is a sectional view illustrating the method of manufacturing the memory cell array.

Subsequently, as shown in FIG. 30, the stopper layer 53 is etched, for example, by RIE, using again the mask layer 58 as a mask, thereby exposing the insulating layer 41. Thereafter, the mask layer 58 is removed.

Figure 31:
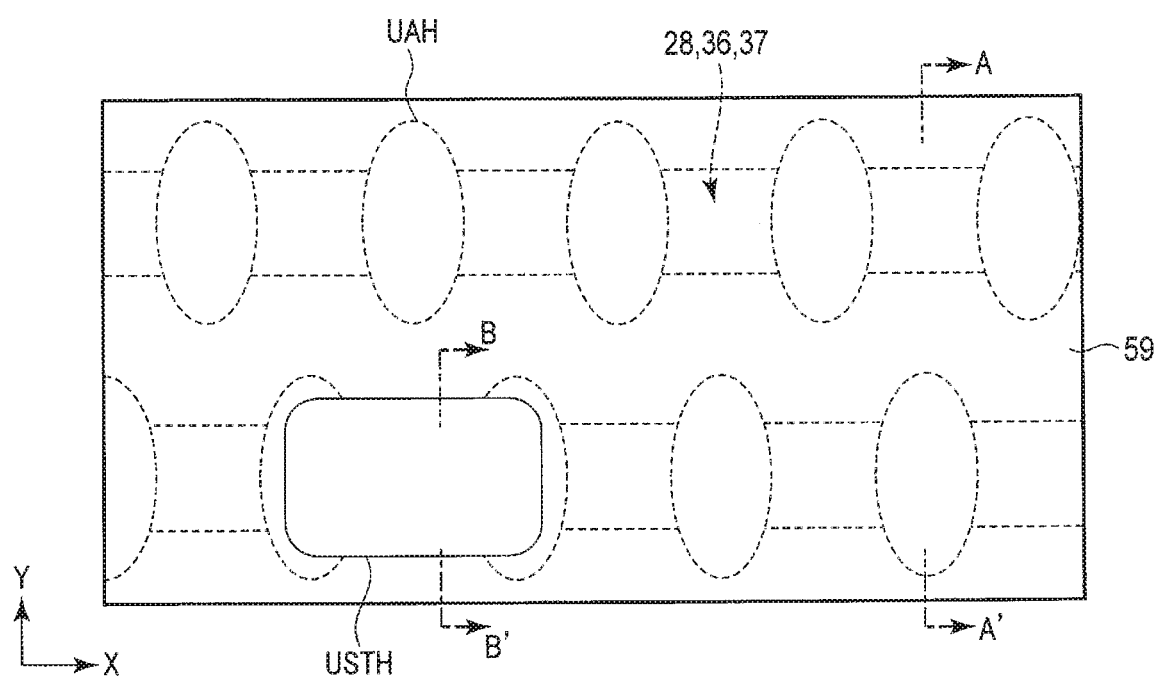
FIG. 31 is a plan view illustrating the method of manufacturing the memory cell array.
Figure 32:
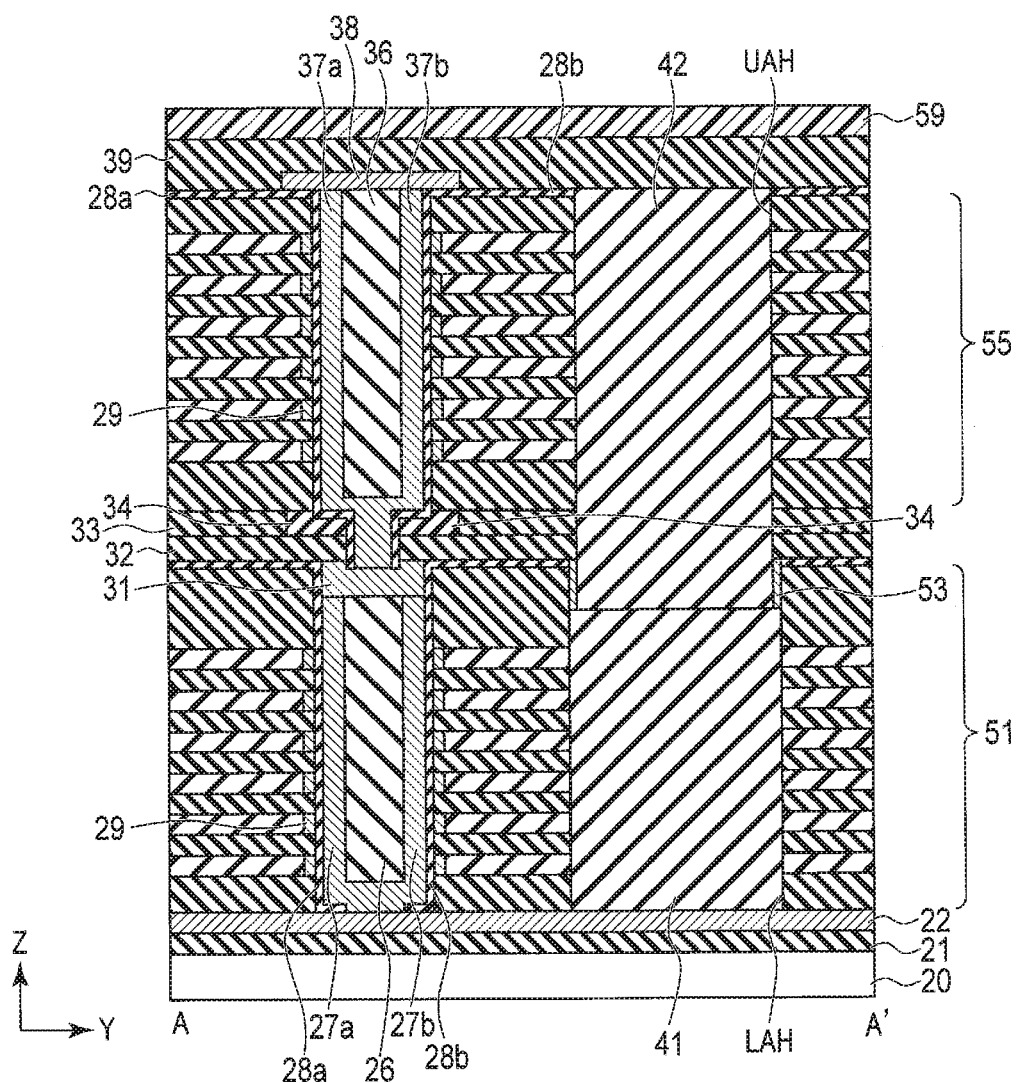
FIG. 32 is a sectional view illustrating the method of manufacturing the memory cell array.
Figure 33:
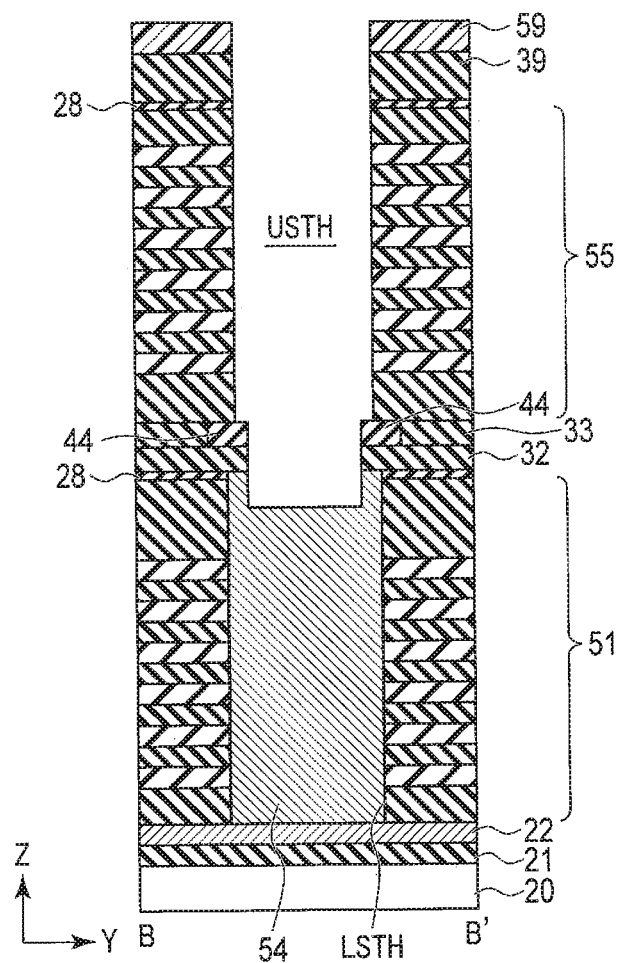
FIG. 33 is a sectional view illustrating the method of manufacturing the memory cell array.

Subsequently, as shown in FIGS. 31 to 33, silicon oxide is filled in each opening UAH by the CVD method, for example. Thereby, an insulating layer 42 is formed in the opening LAH. Subsequently, the insulating layer 42 is made flat by CMP, for example, and the residual portions of the semiconductor layer 37 and the core layer 36 are removed. Subsequently, a connection member 38 made of polycrystalline silicon is formed on the semiconductor layers 37*a* and 37*b* and the core layer 36, for example, by the CVD method and RIE. Subsequently, an insulating layer 39 made of silicon oxide is formed on the stacked body by the CVD method, for example.

Subsequently, a mask layer 59 for exposing the region where replacement hole USTH is to be formed is formed on the insulating layer 39 by lithography. In plan view, the region where replacement hole USTH is to be formed is substantially at the same position as the region where the above-mentioned replacement hole LSTH is formed.

Subsequently, by using the mask layer 59 as a mask, replacement hole USTH reaching the sacrifice layer 54 is formed in the laminated film 55 by RIE, for example. In this etching step, the two cover layers 44 are not completely removed, and the sacrifice layer 54 is exposed through the gap between the two cover layers 44.

Figure 34:
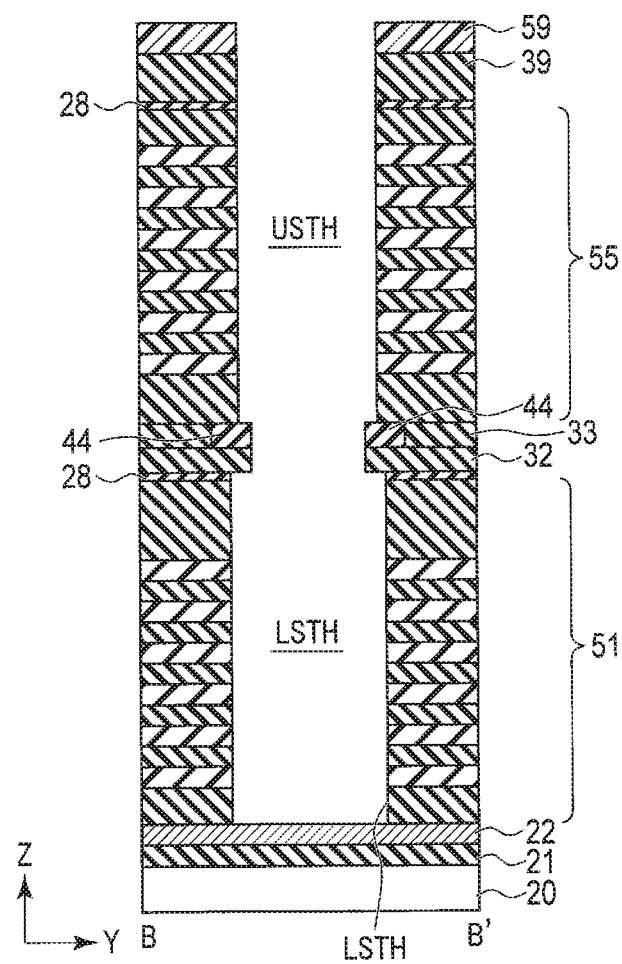
FIG. 34 is a sectional view illustrating the method of manufacturing the memory cell array.

Subsequently, as shown in FIG. 34, the sacrifice layer 54 is removed by RIE or wet etching. As a result, a plurality of sacrifice layers 50 are exposed in replacement holes LSTH and USTH.

Figure 35:
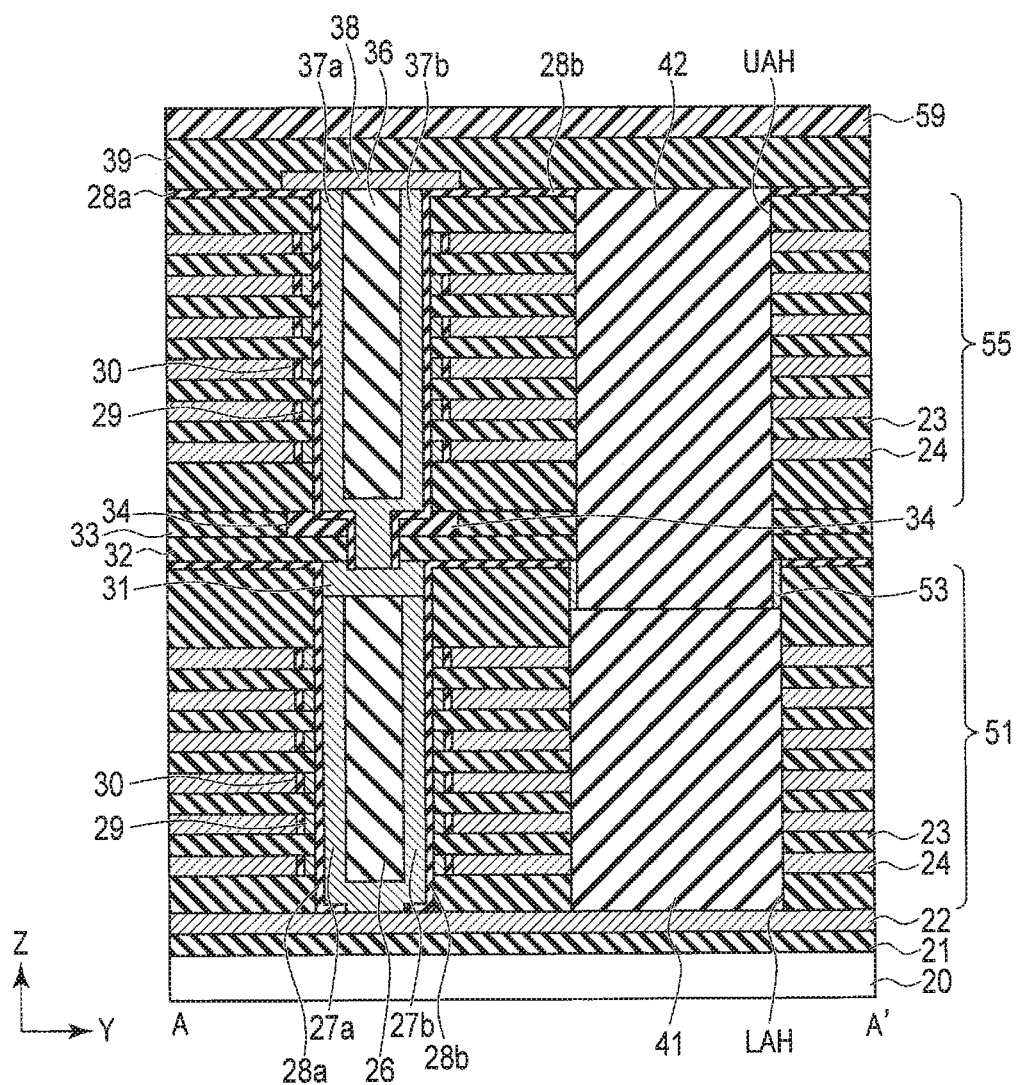
FIG. 35 is a sectional view illustrating the method of manufacturing the memory cell array.

Subsequently, as shown in FIGS. 35 and 36, the sacrifice layers 50 are replaced with wiring layers 24 (word line WL). Specifically, the sacrifice layers 50 are removed by performing wet etching using phosphoric acid ($H_3PO_4$) as an etchant. As a result, the floating gate electrode 29 is exposed in the recesses in which the sacrifice layers 50 are formed.

Subsequently, a block insulating film 30 is formed on the side surface of the floating gate electrode 29 by the CVD method, for example. The block insulating film 30 is, for example, a laminated film in which a first film made of hafnium oxide ($HfO_2$), a second film made of silicon oxide, and a third film made of hafnium oxide are stacked in this order. Although not shown in the drawings, a block insulating film 30 is formed on the upper and lower interlayer insulating layers 23 as well.

Subsequently, a control gate electrode 24 is formed on the side surface of the block insulating film 30 by the CVD method, for example, such that the control gate electrode 24 fills the recesses in which the sacrifice layers 50 were formed. The control gate electrode 24 includes a main body portion made of tungsten (W), for example, and a barrier metal film (not shown) covering the upper surface, side surface and bottom surface of the main body portion and made of titanium nitride (TiN), for example.

Subsequently, residual layers (layers constituting the block insulating film 30 and the control gate electrode 24) formed on the side surfaces of the replacement holes LSTH and USTH are removed by RIE, for example. Thereafter, the mask layer 59 is removed.

Subsequently, as shown in FIG. 5, silicon oxide is filled in the replacement holes LSTH and USTH by the CVD method, for example. As a result, an insulating layer 43 is formed in the replacement holes LSTH and USTH.

Subsequently, as shown in FIGS. 3 to 5, a contact plug 40 electrically connected to the connection member 38 is formed on the connection member 38 and inside the insulating layer 39. Subsequently, a bit line BL electrically connected to the contact plug 40 is formed on the contact plug 40 and the insulating layer 39.

In the manner mentioned above, a memory cell array according to the present embodiment is formed.

[3] Advantages of Embodiment

A description will be given of the advantages of the present embodiment.

The first stacked body TR1 includes semiconductor layer 27a extending in the Z direction, and a memory film (including a tunnel insulating film 28a, a floating gate electrode 29, and a block insulating film 30) provided on side surfaces of semiconductor layer 27a. Above the semiconductor layer 27a and the memory film, a first cover layer 34 covering these is provided. Likewise, the first stacked body TR1 includes semiconductor layer 27b provided in the same opening 25 as semiconductor layer 27a and extending in the Z direction, and a memory film (a tunnel insulating film 28b, a floating gate electrode 29 and a block insulating film 30) provided on the side surfaces of semiconductor layer 27b. Above semiconductor layer 27b and the memory film, a second cover layer 34 covering these is provided. The cover layers 34 are made, for example, of a material (e.g., amorphous silicon) having a high etching selection ratio with respect to the interlayer insulating layers made of silicon oxide. Owing to this, when the memory trench 57 is formed in the second stacked body TR2, the semiconductor layers 27 and the memory films can be protected, so that the semiconductor layers 27 and the memory films can be prevented from being partially etched.

In addition, a joining member 31 is provided on the semiconductor layers 27a and 27b and the core layer 26. The joining member 31 formed, for example, of a conductive material (e.g., amorphous silicon) that has a high etching selection ratio with respect to interlayer insulating layers made of silicon oxide. Thus, when a memory trench 57 is formed in the second stacked body TR2, the joining member 31 can be used as an etching stopper. Therefore, the memory trench 57 can be easily fabricated to have a desired shape.

In addition, the second stacked body TR2 includes semiconductor layers 37a and 37b extending in the Z direction. Semiconductor layers 37a and 37b are connected to each other at their lower end portions, and the lower end portions are electrically connected to the joining member 31. Semiconductor layers 37a and 37b are connected to the joining member 31 through the gap between the two cover layers 34 aligned in the Y direction. That is, the width of the lower end portion of each semiconductor layer 37 is defined by the interval between the two cover layers 34. Owing to this, the widths of the lower end portions of the semiconductor layers 37 can be made substantially the same. As a result, variations in the connection resistance between semiconductor layers 27 and semiconductor layers 37 can be suppressed.

In addition, the first stacked body TR1 is provided with an opening LAH and an insulating layer 41 that divide two memory groups MG adjacent in the X direction. A stopper layer 53 is provided on the insulating layer 41. The stopper layer 53 is made of the same material as the joining member 31 and formed thicker than the joining member 31. Owing to this, even where etching is performed twice (specifically, RIE for forming the memory trench 57 and RIE for forming opening UAH), the two etching operations can be controlled with the stopper layer 53. As a result, the opening UAH and the insulating layer 42 having desired shapes can be formed.

According to the present embodiment, it is possible to provide a highly reliable semiconductor memory device and a manufacturing method thereof.

[4] Modification

In connection with the above embodiment, reference was made to an FG (floating gate) type memory cell array that uses a conductive layer as a charge storage layer. However, a MONOS (metal-oxide-nitride-oxide-silicon) type may be used instead.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first stacked body including:
a first semiconductor region extending in a first direction;
a plurality of first wiring layers arranged apart from each other along the first direction;
a first memory film provided between the first semiconductor region and the first wiring layers;
a second semiconductor region extending in the first direction;
a plurality of second wiring layers arranged apart from each other along the first direction;
a second memory film provided between the second semiconductor region and the second wiring layers; and
a first insulating layer provided between the first semiconductor region and the second semiconductor region;
a joining member provided on the first semiconductor region, the second semiconductor region, and the first insulating layer and made of a conductive material;
a first layer provided above the joining member and covering the first semiconductor region and the first memory film in plan view;
a second layer provided above the joining member, located away from the first layer as viewed in a second direction perpendicular to the first direction, and covering the second semiconductor region and the second memory film in plan view;
a second stacked body including:
a third semiconductor region arranged above the first layer and extending in the first direction;
a plurality of third wiring layers arranged apart from each other along the first direction;
a third memory film provided between the third semiconductor region and the third wiring layers;
a fourth semiconductor region arranged above the second layer and extending in the first direction;
a plurality of fourth wiring layers arranged apart from each other along the first direction;
a fourth memory film provided between the fourth semiconductor region and the fourth wiring layers; and
a second insulating layer provided between the third semiconductor region and the fourth semiconductor region;
a fifth semiconductor region provided between the first layer and the second layer, electrically connecting the third semiconductor region and the fourth semiconductor region to each other, and electrically connected to the joining member;
a third insulating layer which separates two regions of the first semiconductor region adjacent to each other in a third direction perpendicular to both the first direction and the second direction, and separates two regions of the second semiconductor region adjacent to each other in the third direction; and
a fourth insulating layer which is provided on the third insulating layer, separates two regions of the third semiconductor region adjacent to each other in the third direction, and separates two regions of the fourth semiconductor region adjacent to each other in the third direction.

2. The device according to claim 1, wherein a width of the fifth semiconductor region, as viewed in the second direction, is less than a width of the joining member, as viewed in the second direction.

3. The device according to claim 1, wherein the first layer has a first surface and a second surface located above the first surface in the first direction, the third semiconductor region is provided above the second surface, and an interlayer insulating film is provided on the first surface, and
the second layer has a third surface and a fourth surface located above the third surface in the first direction, the fourth semiconductor region is provided above the fourth surface, and the interlayer insulating film is provided on the third surface.

4. The device according to claim 1, further comprising:
a conductive layer provided above a substrate,
wherein the first stacked body is arranged above the conductive layer, and
the first semiconductor region and the second semiconductor region are electrically connected to the conductive layer.

5. The device according to claim 1, further comprising:
a connection member provided on the third semiconductor region and the fourth semiconductor region and electrically connecting the third semiconductor region and the fourth semiconductor region to each other.

6. The device according to claim 5, further comprising:
a contact plug provided on the connection member; and
a bit line provided on the contact plug and extending in the second direction.

7. A semiconductor memory device comprising:
a first stacked body including:
a first semiconductor region extending in a first direction;
a plurality of first wiring layers arranged apart from each other along the first direction;
a first memory film provided between the first semiconductor region and the first wiring layers;
a second semiconductor region extending in the first direction;
a plurality of second wiring layers arranged apart from each other along the first direction;
a second memory film provided between the second semiconductor region and the second wiring layers; and
a first insulating layer provided between the first semiconductor region and the second semiconductor region;
a joining member provided on the first semiconductor region, the second semiconductor region, and the first insulating layer and made of a conductive material;
a first layer provided above the joining member and covering the first semiconductor region and the first memory film in plan view;
a second layer provided above the joining member, located away from the first layer as viewed in a second direction perpendicular to the first direction, and covering the second semiconductor region and the second memory film in plan view;
a second stacked body including:
a third semiconductor region arranged above the first layer and extending in the first direction;
a plurality of third wiring layers arranged apart from each other along the first direction;
a third memory film provided between the third semiconductor region and the third wiring layers;

a fourth semiconductor region arranged above the second layer and extending in the first direction;

a plurality of fourth wiring layers arranged apart from each other along the first direction;

a fourth memory film provided between the fourth semiconductor region and the fourth wiring layers; and a second insulating layer provided between the third semiconductor region and the fourth semiconductor region;

a fifth semiconductor region provided between the first layer and the second layer, electrically connecting the third semiconductor region and the fourth semiconductor region to each other, and electrically connected to the joining member, wherein each of the first to fourth memory films includes a tunnel insulating film, a charge storage layer, and a block insulating film.

8. The device according to claim 7, wherein the tunnel insulating film is provided between the first layer and the fifth semiconductor region and between the second layer and the fifth semiconductor region.

9. A semiconductor memory device comprising:

a first stacked body including:

a first semiconductor region extending in a first direction;

a plurality of first wiring layers arranged apart from each other along the first direction;

a first memory film provided between the first semiconductor region and the first wiring layers;

a second semiconductor region extending in the first direction;

a plurality of second wiring layers arranged apart from each other along the first direction;

a second memory film provided between the second semiconductor region and the second wiring layers; and a first insulating layer provided between the first semiconductor region and the second semiconductor region;

a joining member provided on the first semiconductor region, the second semiconductor region, and the first insulating layer and made of a conductive material;

a first layer provided above the joining member and covering the first semiconductor region and the first memory film in plan view;

a second layer provided above the joining member, located away from the first layer as viewed in a second direction perpendicular to the first direction, and covering the second semiconductor region and the second memory film in plan view;

a second stacked body including:

a third semiconductor region arranged above the first layer and extending in the first direction;

a plurality of third wiring layers arranged apart from each other along the first direction;

a third memory film provided between the third semiconductor region and the third wiring layers;

a fourth semiconductor region arranged above the second layer and extending in the first direction;

a plurality of fourth wiring layers arranged apart from each other along the first direction;

a fourth memory film provided between the fourth semiconductor region and the fourth wiring layers; and a second insulating layer provided between the third semiconductor region and the fourth semiconductor region;

a fifth semiconductor region provided between the first layer and the second layer, electrically connecting the third semiconductor region and the fourth semiconductor region to each other, and electrically connected to the joining member, wherein each of the first and second layers is made of a conductive material.

* * * * *